US011553610B2

(12) United States Patent
Lee et al.

(10) Patent No.: US 11,553,610 B2
(45) Date of Patent: Jan. 10, 2023

(54) DISPLAY DEVICE

(71) Applicant: LG DISPLAY CO., LTD., Seoul (KR)

(72) Inventors: Hyosung Lee, Gwangmyeong-si (KR); SeungHee Lee, Goyang-si (KR); MiJin Han, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 115 days.

(21) Appl. No.: 17/080,301

(22) Filed: Oct. 26, 2020

(65) Prior Publication Data

US 2021/0127512 A1    Apr. 29, 2021

(30) Foreign Application Priority Data

Oct. 25, 2019  (KR) .................. 10-2019-0133467

(51) Int. Cl.
| | |
|---|---|
| H05K 7/02 | (2006.01) |
| H05K 7/04 | (2006.01) |
| H05K 5/02 | (2006.01) |
| H05K 5/00 | (2006.01) |
| H01L 27/32 | (2006.01) |
| H01L 51/00 | (2006.01) |
| G09G 3/3225 | (2016.01) |
| G09G 3/00 | (2006.01) |

(52) U.S. Cl.
CPC ....... *H05K 5/0217* (2013.01); *H01L 27/3244* (2013.01); *H01L 51/0097* (2013.01); *H05K 5/0017* (2013.01); *G09G 3/035* (2020.08); *G09G 3/3225* (2013.01); *G09G 2380/02* (2013.01); *H01L 2251/5338* (2013.01)

(58) Field of Classification Search
CPC .......................... H05K 5/0017; H05K 5/0217
USPC .................. 361/807, 755, 809, 810
See application file for complete search history.

(56) References Cited

U.S. PATENT DOCUMENTS

| | | |
|---|---|---|
| 1,916,517 A | 7/1933 | Long |
| 8,113,975 B2 | 2/2012 | Ritz et al. |
| 8,763,482 B2 | 7/2014 | Fejer et al. |
| 8,967,005 B2 | 3/2015 | Saji et al. |
| 11,272,626 B2* | 3/2022 | Lee ........................ G06F 1/1601 |
| 2004/0220004 A1* | 11/2004 | Bourc'His ................ B66F 3/06 |
| | | 474/152 |

(Continued)

FOREIGN PATENT DOCUMENTS

| | | |
|---|---|---|
| CN | 103328854 A | 9/2013 |
| CN | 103492756 A | 1/2014 |

(Continued)

*Primary Examiner* — Hung S. Bui
(74) *Attorney, Agent, or Firm* — Birch, Stewart, Kolasch & Birch, LLP

(57) ABSTRACT

A display device according to an embodiment of the present disclosure includes a display panel, a roller on which the display panel is wound or unwound, and a lifting unit configured to move the display panel in a vertical direction, wherein the lifting unit includes a plurality of chain units configured to be coupled when ascending and separated from each other when descending, a first power transmission unit configured to lift the plurality of chain units, and a second power transmission unit configured to couple or separate the plurality of chain units by switching movement directions of the plurality of chain units, so that durability and wobbling of the display device can be improved.

22 Claims, 17 Drawing Sheets

(56) References Cited

U.S. PATENT DOCUMENTS

| | | | | |
|---|---|---|---|---|
| 2011/0011542 A1* | 1/2011 | Kuroi | .................... | G03B 21/58 |
| | | | | 160/133 |
| 2012/0167542 A1* | 7/2012 | Oitaka | .................... | F16G 13/20 |
| | | | | 59/85 |
| 2017/0344073 A1* | 11/2017 | Kang | .................... | G06F 1/1652 |

FOREIGN PATENT DOCUMENTS

| | | |
|---|---|---|
| CN | 107452282 A | 12/2017 |
| CN | 107993574 A | 5/2018 |
| JP | 4822734 B2 | 11/2011 |
| KR | 1998-040929 U | 9/1998 |
| KR | 10-2009-0008334 A | 1/2009 |
| KR | 10-1080639 B1 | 11/2011 |
| KR | 10-2013-0132976 A | 12/2013 |
| KR | 10-1541644 B1 | 8/2015 |
| KR | 10-1542166 B1 | 8/2015 |
| WO | WO 2016/200081 A | 12/2016 |

\* cited by examiner

DISPLAY DEVICE

CROSS-REFERENCE TO RELATED APPLICATIONS

This application claims the priority benefit of Korean Patent Application No. 10-2019-0133467 filed on Oct. 25, 2019, in the Korean Intellectual Property Office, the entire contents of which are incorporated herein by reference into the present application.

BACKGROUND

Technical Field

The present disclosure relates to a display device, and more particularly, to a display device capable of displaying an image even when the display device is rolled.

Description of the Related Art

Display devices used for a computer monitor, a TV, and a mobile phone include an electroluminescence display device that emits light by itself, a liquid crystal display (LCD) device that requires a separate light source, and the like.

Such display devices are being applied to various fields including not only a computer monitor and a TV, but personal mobile devices, and thus, display devices having a reduced volume and weight while having a wide display area are being studied.

Recently, a flexible display device manufactured to be able to display an image even when the display device is rolled, by forming a display element, lines and the like on a flexible substrate, such as plastic which is a flexible material, has received considerable attraction as the next-generation display device.

SUMMARY

An object to be achieved by the present disclosure is to provide a display device capable of preventing wobbling of a lifting unit.

Another object to be achieved by the present disclosure is to provide a display device capable of stably lifting a display panel using a zipper-type chain unit.

Still another object to be achieved by the present disclosure is to provide a display device capable of unwinding and winding a display panel with a small amount of power.

Objects of the present disclosure are not limited to the above-mentioned objects, and other objects, which are not mentioned above, can be clearly understood by those skilled in the art from the following descriptions.

According to an aspect of the present disclosure, a display device includes a display panel, a roller on which the display panel is wound or unwound, and a lifting unit configured to move the display panel in a vertical direction, wherein the lifting unit includes a plurality of chain units configured to be coupled when ascending and separated when descending, a first power transmission unit configured to lift the plurality of chain units, and a second power transmission unit configured to couple or separate the plurality of chain units by switching movement directions of the plurality of chain units.

According to another aspect of the present disclosure, a display device includes a display panel, a roller on which the display panel is wound or unwound, a plurality of chain units configured to lift the display panel, and power transmission units disposed in plural numbers along movement paths of the plurality of chain units and configured to transmit power to the chain units in at least one position thereof.

Other detailed matters of the exemplary embodiments are included in the detailed description and the drawings.

According to the present disclosure, reliability of a display device can be improved by preventing wobbling of a lifting unit.

According to the present disclosure, with the use of a zipper-type chain unit, durability can be improved, and a display panel can be stably raised.

According to the present disclosure, two pairs of sprockets are configured to transmit power to a chain unit, thereby securing driving stability and can unwind and wind a display panel with a small amount of power.

The effects and advantages according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1A:
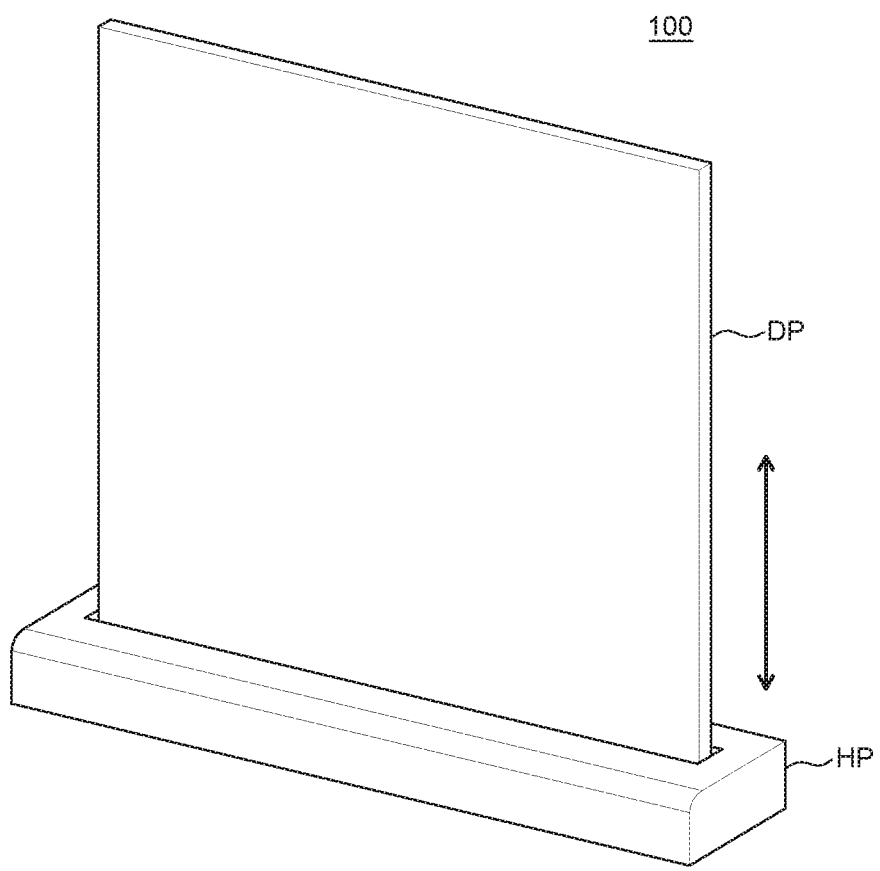
FIGS. 1A and 1B are perspective views of a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular can include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components and may not define any order. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

<Display Device-Rollable Display Device>

A rollable display device can also be referred to as a display device which is capable of displaying images even though the display device is rolled. The rollable display device can have a high flexibility as compared with a general display device of the related art. Depending on whether to use a rollable display device, a shape of the rollable display device can be freely varied. Specifically, when the rollable display device is not used, the rollable display device is rolled to be stored with a reduced volume. In contrast, when the rollable display device is used, the rolled rollable display device is unrolled to be used.

Figure 1B:
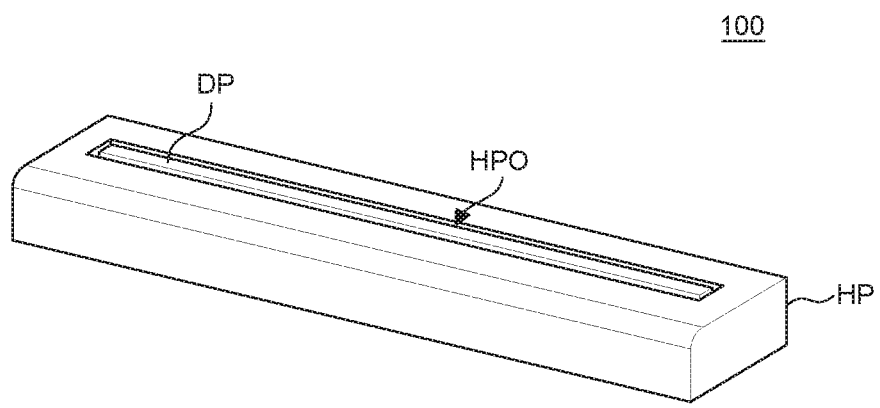

FIGS. 1A and 1B are perspective views of a display device according to an exemplary embodiment of the present disclosure. All components of the display device according to all embodiments of the present disclosure are operatively coupled and configured.

With reference to FIGS. 1A and 1B, a display device 100 according to an exemplary embodiment of the present disclosure includes a display part DP and a housing part HP.

The display part DP is configured to display images to a user. For example, display elements, circuits for driving the display elements, lines, and other components can be disposed in the display part DP. In this case, since the display device 100 according to an exemplary embodiment of the present disclosure is a rollable display device 100, the display part DP can be configured to be wound and unwound. For example, the display part DP can be formed of a display panel and a back cover that are flexible so that they can be wound or unwound. A more detailed description of the display part DP will be described later with reference to FIGS. 3 and 4.

The housing part HP serves as a case where the display part DP can be accommodated, e.g., by being wound and unwound upwardly and downwardly in and out of the housing part HP. The display part DP can be wound to be accommodated within the housing part HP, and the display part DP can be unwound and can be disposed outside the housing part HP.

The housing part HP can have an opening HPO so that the display part DP can move into and out of the housing part HP. The display part DP can move through the opening HPO of the housing part HP in a vertical direction.

Meanwhile, the display part DP of the display device 100 can be switched from a fully unwound state to a fully wound state or from the fully wound state to the fully unwound state.

FIG. 1A shows a fully unwound state of the display part DP of the display device 100. The fully unwound state refers to a state in which the display part DP of the display device 100 is disposed outside the housing part HP. For example, the fully unwound state can be defined as a state in which the display part DP is unwound and disposed maximally outside the housing part HP in order for a user to view images on the display device 100. And, in the fully unwound state, the display part DP can no longer be unwound.

FIG. 1B shows a fully wound state of the display part DP of the display device 100. The fully wound state refers to a state in which the display part DP of the display device 100 is accommodated within the housing part HP and can no longer be wound. That is, the fully wound state can be defined as a state in which the display part DP is wound to be accommodated within the housing part HP since it is preferable not to dispose the display part DP in the outside of the housing part HP in terms of external appearance, when a user does not view images on the display device 100. Further, in the fully wound state in which the display part DP is accommodated within the housing part HP, the display device 100 is reduced in volume and facilitated to be transported.

Also, the display part DP of the display device 100 can be switched from the fully wound state to a state in which the display part DP is partially unwound. The state in which the display part DP is partially unwound can be defined as a state in which a portion of the display part DP is disposed outside the housing part HP.

Figure 2:
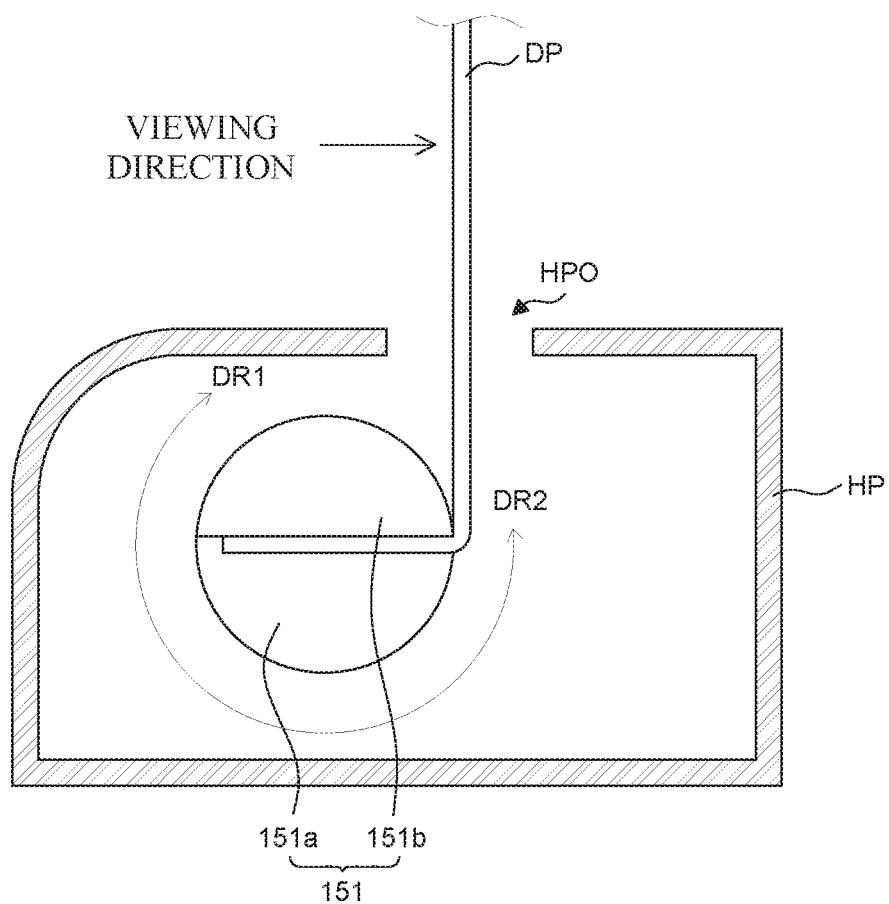
FIG. 2 is a cross-sectional view of the display device according to an exemplary embodiment of the present disclosure.

With reference to FIG. 2, the display part DP can be switched to the fully unwound state or the fully wound state, or the partially unwound state by a driving part MP (see FIG. 6) and the roller 151. For convenience of description, only the housing part HP, the display part DP, and the roller 151 are illustrated in FIG. 2.

The roller 151 is accommodated in the housing part HP to wind or unwind the display part DP. Specifically, the roller 151 is accommodated in the housing part HP to fix a lower edge of the display part DP thereto and rotates clockwise or counterclockwise to wind or unwind the display part DP. For example, when the roller 151 rotates in a first direction DR1, that is, in a clockwise direction, a front surface of the display part DP which is in a viewing direction of the display part DP, is in close contact with a surface of the roller 151 to thereby be wound. And, when the roller 151 rotates in a second direction DR2, that is, in a counterclockwise direction, the display part DP wound on the roller 151 is unwound from the roller 151 and can be disposed outside the housing part HP.

The roller 151 can include a base portion 151*a* and a top cover 151*b*. The lower edge of the display part DP is fixed between the base portion 151*a* and the top cover 151*b* and is engaged with the roller 151. For example, the roller 151 in a state in which the base portion 151*a*, the top cover 151*b*, and the display part DP are coupled to one another can have a cylindrical shape. However, the shape of the roller 151 is not necessarily limited thereto, and various shapes allowing for winding of the display part DP can be applied to the roller 151.

In addition, the roller 151 can wind the display part DP using an elastic force.

Specifically, a spring can be disposed on one side of the roller 151. When the roller 151 rotates in the second direction DR2, the spring can be compressed so that the display part DP is unwound, while when rotational force of the roller 151 in the second direction DR2 is released, the spring allows the roller 151 to rotate in the first direction DR1 using elastic force, thereby winding the display part DP around the roller 151. At this time, the rotational force of the roller 151 to unwind the display part DP by the elastic force of the spring is applied to the display part DP which is unwound from the roller 151, and thus, the display part DP which is exposed to the outside of the housing part HP can maintain a flat state.

<Display Part>

Figure 3:
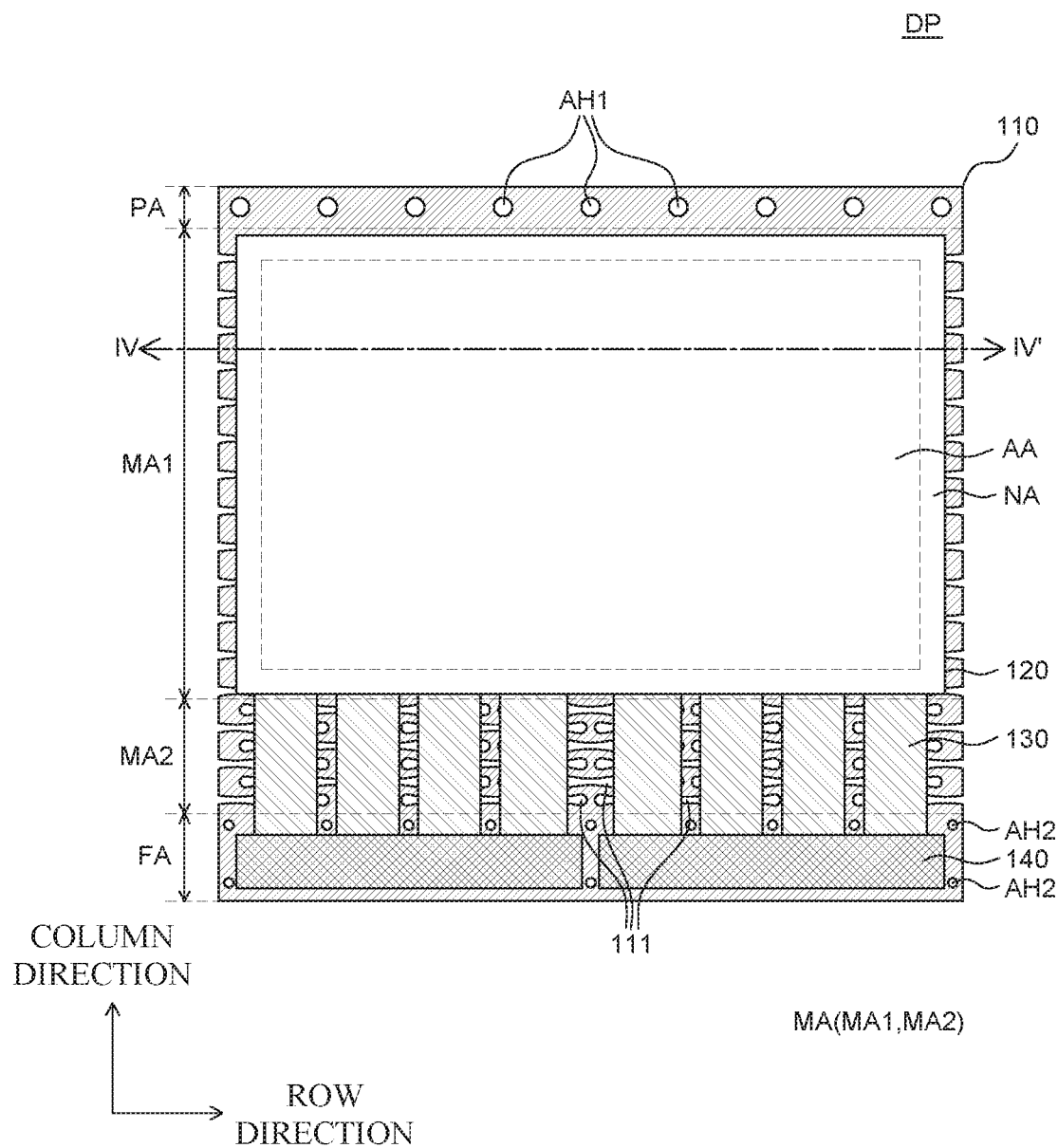
FIG. 3 is a plan view of a display part of the display device according to an exemplary embodiment of the present disclosure.
Figure 4:
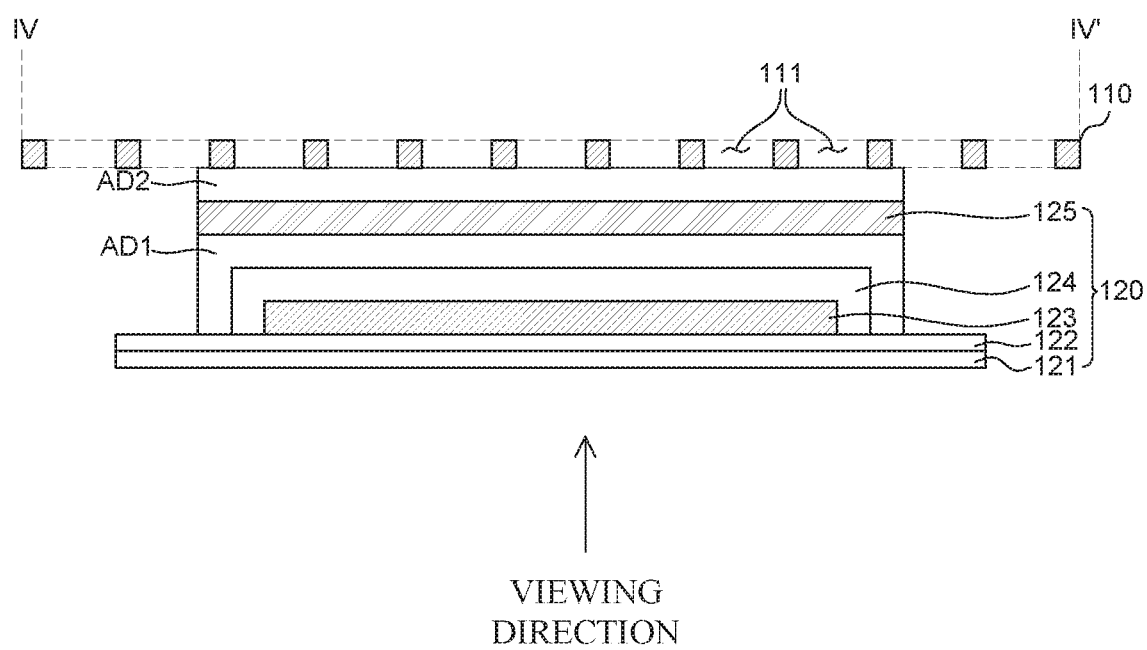
FIG. 4 is a cross-sectional view taken along line IV-IV' of FIG. 3.

FIG. 3 is a plan view of a display part of the display device according to an exemplary embodiment of the present disclosure. FIG. 4 is a cross-sectional view taken along line IV-IV' of FIG. 3.

With reference to FIG. 3, the display part DP of the display device 100 includes a back cover 110, a display panel 120, flexible films 130, and printed circuit boards 140.

The back cover 110 is disposed on rear surfaces of the display panel 120, the flexible film 130, and the printed circuit board 140 and supports the display panel 120, the flexible film 130, and the printed circuit board 140. Therefore, a size of the back cover 110 can be larger than a size of the display panel 120. That is, an outer edge of the back cover 110 can be disposed more outwardly than an outer edge of the display panel 120 corresponding thereto. Accordingly, when the display part DP is disposed outside the housing part HP, the back cover 110 can protect other components of the display part DP, in particular, the display panel 120, from external impacts.

The back cover 110 can be formed of a rigid material, but at least a portion of the back cover 110 can be flexible to be wound or unwound along with the display panel 120. For example, the back cover 110 can be formed of a metallic material such as Steel Use Stainless (SUS) or Invar, or plastic, but is not limited thereto. The material of the back cover 110 can be changed variously depending on a design as long as it can satisfy property requirements such as the amount of thermal deformation, a radius of curvature, rigidity, and the like.

The back cover 110 includes a fixed area FA, a support area PA, and a malleable area MA. Specifically, the back cover 110 includes a support area PA in an uppermost portion thereof, a fixed area FA in a lowermost portion thereof, and a malleable area MA between the support area PA and the fixed area FA. The support area PA is an area in which a plurality of openings 111 are not disposed, and the support area PA is fastened with a head bar 164 (see FIG. 6). The malleable area MA is an area in which the plurality of openings 111 are disposed and on which winding or unwinding is substantially performed. The fixed area FA is an area for fixing the back cover 110 together with the printed circuit boards 140 and the flexible films 130, to the roller 151.

The support area PA of the back cover 110 is an uppermost area of the back cover 110 and is fastened with the head bar 164. First fastening holes AH1 through which screws pass can be formed in the support area PA to be fastened with the head bar 164. Accordingly, the head bar 164 and the support area PA of the back cover 110 can be fastened with each other. As the support area PA is fastened with the head bar 164, when a lifting unit 160 (see FIG. 6) which is fastened to the head bar 164 ascends or descends, the back cover 110 can also ascend or descend, together with the display panel 120 which is attached to the back cover 110. Although nine first fastening holes AH1 are illustrated in FIG. 3, the number of first fastening holes AH1 is not limited thereto. Further, although FIG. 3 illustrates that the back cover 110 is fastened with the head bar 164 using the first fastening holes AH1, the present disclosure is not limited thereto. The back cover 110 and the head bar 164 can be fastened with each other without a separate fastening hole.

The fixed area FA of the back cover 110 is a lowermost area of the back cover 110 and is fastened with the roller 151. Second fastening holes AH2 through which screws pass can be formed in the fixed area FA to be fastened with the roller 151. Accordingly, the roller 151 and the fixed area FA of the back cover 110 can be fastened with each other. As the fixed area FA is fastened with the roller 151, the back cover 110 can be wound on or unwound from the roller 151 by rotation of the roller 151. Meanwhile, the number of a plurality of the second fastening holes AH2 illustrated in FIG. 3 is exemplary, and the number of the plurality of second fastening holes AH2 can be determined based on the number of the printed circuit boards 140, the number of the flexible films 130, and the like.

The printed circuit boards 140 and the flexible films 130 connected to one end of the display panel 120 are disposed in the fixed area FA to be fixed thereto. A portion of the second fastening holes AH2 through which the screws pass can be disposed between the respective flexible films 130, so that the flexible films 130 can be more stably fixed. The fixed area FA can allow the flexible film 130 and the printed circuit board 140 to be fastened to the roller 151 in a flat form rather than a curved form, in order to protect the flexible film 130 and the printed circuit board 140. At this time, a portion of the roller 151 to which the fixed area FA is coupled can be formed in a flat shape corresponding to the fixed area FA. A more detailed description of this will be described later with reference to FIG. 5.

The malleable area MA of the back cover 110 is an area which is wound on or unwound from the roller 151, together with the display panel 120. The malleable area MA can overlap a portion of the display panel 120 and the flexible film 130.

The plurality of openings 111 are disposed in the malleable area MA of the back cover 110. When the display part DP is wound or unwound, the plurality of openings 111 can be deformed by a stress which is applied to the display part DP. Specifically, when the display part DP is wound or unwound, the malleable area MA of the back cover 110 can be deformed as the plurality of openings 111 are contracted or expanded. Further, as the plurality of openings 111 are contracted or expanded, a slip phenomenon of the display panel 120 disposed on the malleable area MA of the back cover 110 is minimized, whereby the stress which is applied to the display panel 120 can be minimized.

When the display panel 120 and the back cover 110 are wound, a difference between a length of the display panel 120 which is wound on the roller 151 and a length of the back cover 110 which is wound on the roller 151 can be caused by a difference in radius of curvature between the display panel 120 and the back cover 110. For example, when the back cover 110 and the display panel 120 are wound on the roller 151, a length of the back cover 110 required for being wound on the roller 151 once can be different from a length of the display panel 120 required for being wound on the roller 151 once. For example, since the display panel 120 is disposed outwardly than the back cover 110 with respect to the roller 151, the length of the display panel 120 required to be wound on the roller 151 once can be greater than the length of the back cover 110 required to be wound on the roller 151 once. As described above, wound lengths of the back cover 110 and the display panel 120 are different from each other due to the difference in radius of curvature therebetween at the time of winding the display part DP, and the display panel 120 attached to the back cover 110 can slide and move from its original position. In this case, a phenomenon in which the display panel 120 slides from the back cover 110 due to the stress and the difference in radius of curvature caused by the winding can be defined as a slip phenomenon. When the slip phenomenon excessively increases, the display panel 120 can be detached from the back cover 110 or defects such as cracks can be caused.

In this case, in the display device 100 according to an exemplary embodiment of the present disclosure, even when the display part DP is wound or unwound and is subjected to a stress, the plurality of openings 111 of the back cover 110 can be flexibly deformed to relieve the stress applied to the back cover 110 and the display panel 120. For example, when the back cover 110 and the display panel 120 are wound on the roller 151, a stress which deforms the back cover 110 and the display panel 120 in a vertical direction can be applied. In this case, the plurality of openings 111 of the back cover 110 can extend in a vertical direction of the back cover 110, and the length of the back cover 110 can be flexibly deformed. Therefore, a difference in the lengths of the back cover 110 and the display panel 120 caused by the difference in radius of curvature during a process of winding the back cover 110 and the display panel 120 can be compensated by the plurality of openings 111 of the back cover 110. Further, the plurality of openings 111 are deformed during the process of winding the back cover 110 and the display panel 120, so that a stress which is applied to the display panel 120 from the back cover 110 can also be relieved.

Meanwhile, in the support area PA and the fixed area FA, the plurality of openings 111 as formed in the malleable area MA are not formed. That is, in the support area PA and the fixed area FA, only the first fastening holes AH1 and the second fastening holes AH2 are formed, but the plurality of openings 111 as formed in the malleable area MA are not formed. Further, the first fastening holes AH1 and the second fastening holes AH2 have shapes different from that of the plurality of openings 111. The support area PA and the fixed area FA which are fixed to the head bar 164 and the roller 151, respectively, need to be more rigid than the malleable area MA. Specifically, as the support area PA and the fixed area FA have the rigidity, the support area PA and the fixed area FA can be firmly fixed to the head bar 164 and the roller 151, respectively. Therefore, the display part DP is fixed to the roller 151 and the head bar 164 of the driving part MP, thereby moving into or out of the housing part HP according to an operation of the driving part MP.

In the display device 100 according to an exemplary embodiment of the present disclosure, the back cover 110 provided with the plurality of openings 111 is disposed on the rear surface of the display panel 120 to support and protect the display panel 120. The back cover 110 is formed of a metallic material or the like to have a rigidity. The plurality of openings 111 are formed in the malleable area MA of the back cover 110 where the display panel 120 is disposed, so that the flexibility of the back cover 110 can be enhanced. Therefore, in the fully unwound state in which the display part DP of the display device 100 is disposed outside the housing part HP, the back cover 110 having high rigidity can support the display panel 120 such that the display panel 120 spread in a flat manner. On the other hand, in the fully wound state in which the display part DP of the display device 100 is accommodated in the housing part HP, the back cover 110 having high flexibility due to the plurality of openings 111, together with the display panel 120, can be wound on the roller 151 and accommodated in the housing part HP.

With reference to FIG. 3, the malleable area MA includes a first malleable area MA1 extending from the support area PA and a second malleable area MA2 between the first malleable area MA1 and the fixed area FA.

The first malleable area MA1 is an area in which a plurality of openings are disposed and to which the display panel 120 is attached. The second malleable area MA2 is an area extending from the first malleable area MA1 to the fixed area FA. The plurality of openings 111 are disposed in the second malleable area MA2, but the display panel 120 is not disposed therein. In addition, at least a portion of the flexible film 130 which extends from the display panel 120 to the printed circuit board 140 is disposed in the second malleable area MA2.

The second malleable area MA2 is an area which extends so that a display area AA of the display panel 120 can be disposed outside the housing part HP. For example, when the back cover 110 and the display panel 120 are fully unwound, the fixed area FA to which the printed circuit board 140 is attached and which is fixed to the roller 151 to the second malleable area MA2 to which the flexible film 130 is attached can be disposed within the housing part HP, while the support area PA and the first malleable area MA1 to which the display panel 120 is attached can be disposed outside the housing part HP.

The display panel 120 is a panel for displaying images to a user. The display panel 120 can include a display element which displays images, a driving element which drives the display element, and lines which transmit various signals to the display elements and the driving elements.

The display element can be defined in different ways depending on a type of the display panel 120. For example, when the display panel 120 is an organic light emitting display panel, the display element can be an organic light emitting element which includes an anode, an organic light emitting layer, and a cathode. For example, when the display panel 120 is a liquid crystal display panel, the display element can be a liquid crystal display element. Further, when the display panel 120 is a light emitting display panel including LEDs, the display element can be an LED. Hereinafter, even though the display panel 120 is assumed as an organic light emitting display panel, the display panel 120 is not limited to the organic light emitting display panel. Further, since the display device 100 according to an exemplary embodiment of the present disclosure is a rollable display device, the display panel 120 can be implemented as a flexible display panel to be wound on or unwound from the roller 151.

Referring to FIG. 3, the display panel 120 includes the display area AA and a non-display area NA.

The display area AA is an area where images are displayed in the display panel 120. In the display area AA, a plurality of sub-pixels constituting a plurality of pixels and driving circuits for driving the plurality of sub-pixels can be disposed. The plurality of sub-pixels are minimum units which configure the display area AA, and the display element can be disposed in each of the plurality of sub-pixels. For example, an organic light emitting element which includes an anode, an organic light emitting layer, and a cathode can be disposed in each of the plurality of sub-pixels, but the present disclosure is not limited thereto. Further, the circuits for driving the plurality of sub-pixels can include driving elements and lines. For example, the circuit can be formed of a thin film transistor, a storage capacitor, a gate line, and a data line, but is not limited thereto.

The non-display area NA is an area where no image is displayed. The non-display area NA surrounds an outside of the display area AA. In the non-display area NA, various lines and circuits for driving the organic light emitting element of the display area AA are disposed. For example, in the non-display area NA, a link line which transmits signals to the plurality of sub-pixels and circuits of the display area AA or a driver IC such as a gate driver IC or a data driver IC can be disposed, but the present disclosure is not limited thereto.

The flexible film 130 is a film in which various components are disposed on a base film having flexibility. Since the flexible film 130 is flexible, some areas thereof, together with the second malleable area MA2, can be wound on or unwound from the roller 151. The flexible film 130 supplies a signal to the plurality of sub-pixels and the circuits of the display area AA and can be electrically connected to the display panel 120. The flexible film 130 is disposed on one end of the non-display area NA of the display panel 120 to supply a power voltage or a data voltage to the plurality of sub-pixels and the circuits of the display area AA. The number of flexible films 130 illustrated in FIG. 3 is exemplary, and the number of flexible films 130 can be variously changed according to design, but is not limited thereto.

Meanwhile, for example, a driver IC such as a gate driver IC or a data driver IC can be disposed on the flexible film 130. The driver IC is a component which processes data for displaying images and a driving signal for processing the data. The driver IC can be disposed in a chip on glass (COG), a chip on film (COF), or a tape carrier package (TCP) manner depending on a mounting method. However, for the convenience of description, it is described that the driver IC is mounted on the flexible film 130 in a chip on film manner, but the present disclosure is not limited thereto.

The printed circuit board 140 is disposed on one end of the flexible film 130 and is connected to the flexible film 130. The printed circuit board 140 is a component which supplies signals to the driver IC. The printed circuit board 140 supplies various signals such as a driving signal or a data signal to the driver IC. Various components can be disposed on the printed circuit board 140. For example, a timing controller or a power source unit can be disposed on the printed circuit board 140. Although two printed circuit boards 140 are illustrated in FIG. 3, the number of printed circuit boards 140 can vary depending on a design and is not limited thereto.

An additional printed circuit board connected to the printed circuit board 140 can be further disposed. For example, the printed circuit board 140 can be referred to as a source printed circuit board (source PCB) S-PCB on which a data driver is mounted. The additional printed circuit board connected to the printed circuit board 140 can be referred to as a control printed circuit board (control PCB) C-PCB on which a timing controller or the like is mounted. The additional printed circuit board can be disposed inside the roller 151, or can be disposed within the housing part HP in the outside of the roller 151.

With reference to FIG. 4, the display panel 120 includes a substrate 121, a buffer layer 122, a pixel unit 123, an encapsulation layer 124, and an encapsulation substrate 125.

The substrate 121 which is a base member for supporting various components of the display panel 120 can be configured of an insulating material. The substrate 121 can be formed of a material having flexibility to allow the display panel 120 to be wound or unwound and for example, it can be formed of a plastic material such as polyimide PI.

The buffer layer 122 can suppress moisture and/or oxygen which permeates from the outside of the substrate 121 from being diffused. The buffer layer 122 can be configured of a single layer or a double layer of silicon oxide SiOx and/or silicon nitride SiNx, but is not limited thereto.

The pixel unit 123 includes a plurality of organic light emitting elements and circuits for driving the plurality of organic light emitting elements. The pixel unit 123 can be an area corresponding to the display area AA. The organic light emitting element can include an anode, an organic light emitting layer, and a cathode.

The anode can supply holes to the organic light emitting layer and be formed of a conductive material having a high work function. For example, the anode can be formed of tin oxide (TO), indium tin oxide (ITO), indium zinc oxide (IZO), or indium zinc tin oxide (ITZO), but is not limited thereto.

The organic light emitting layer is supplied with holes from the anode and supplied with electrons from the cathode to thereby emit light. The organic light emitting layer can be formed of a red organic light emitting layer, a green organic light emitting layer, a blue organic light emitting layer, or a white organic light emitting layer depending on a color of light emitted from the organic light emitting layer. In this case, when the organic light emitting layer is a white organic light emitting layer, color filters having various colors can be additionally disposed.

The cathode can supply electrons to the organic light emitting layer and be formed of a conductive material having a low work function. For example, the cathode can be formed of any one or more selected from a group consisting of metals such as magnesium (Mg), silver (Ag), and aluminum (Al), and alloys thereof, but is not limited thereto.

Meanwhile, the display panel 120 can be configured in a top emission type or a bottom emission type, depending on an emission direction of light which is emitted from the organic light emitting element.

In the top emission type, light emitted from the organic light emitting element is emitted upwardly of the substrate 121 on which the organic light emitting element is formed. In the case of the top emission type, a reflective layer can be formed under the anode to allow the light emitted from the organic light emitting element to travel upwardly of the substrate 121, that is, toward the cathode.

In the bottom emission type, light emitted from the organic light emitting element is emitted downwardly of the substrate 121 on which the organic light emitting element is formed. In the case of the bottom emission type, the anode can be formed only of a transparent conductive material to allow the light emitted from the organic light emitting element to travel downwardly of the substrate 121, and the cathode can be formed of a metallic material having high reflectivity.

Hereinafter, for the convenience of description, a description will be made assuming that the display device 100 according to an exemplary embodiment of the present disclosure is a bottom emission type display device, but the present disclosure is not limited thereto.

A circuit for driving the organic light emitting element is disposed in the pixel unit 123. The circuit can be formed of a thin film transistor, a storage capacitor, a gate line, a data line, and a power line, but it can be changed variously depending on the design of the display device 100.

The encapsulation layer 124 which covers the pixel unit 123 is disposed on the pixel unit 123. The encapsulation layer 124 seals the organic light emitting element of the pixel unit 123. The encapsulation layer 124 can protect the organic light emitting element of the pixel unit 123 from external moisture, oxygen and impacts. The encapsulation layer 124 can be formed by alternately stacking a plurality of inorganic layers and a plurality of organic layers. For example, the inorganic layer can be formed of an inorganic material such as silicon nitride SiNx, silicon oxide SiOx, or aluminum oxide AlOx, and the organic layer can be formed of an epoxy-based or acrylic polymer, but they are not limited thereto.

The encapsulation substrate 125 is disposed on the encapsulation layer 124. The encapsulation substrate 125 protects the organic light emitting element of the pixel unit 123, together with the encapsulation layer 124. The encapsulation substrate 125 can protect the organic light emitting element of the pixel unit 123 from external moisture, oxygen, and impacts. The encapsulation substrate 125 can be formed of a metallic material, which has high corrosion resistance and is easily processed in the form of foil or thin film, such as aluminum (Al), nickel (Ni), chromium (Cr), or an alloy material of iron (Fe) and nickel. Therefore, as the encapsulation substrate 125 is formed of a metallic material, the encapsulation substrate 125 can be implemented as an ultra-thin film and have high resistance against external impacts and scratches.

A first adhesive layer AD1 can be disposed between the encapsulation layer 124 and the encapsulation substrate 125. The first adhesive layer AD1 can bond the encapsulation layer 124 and the encapsulation substrate 125 to each other. The first adhesive layer AD1 is formed of a material having adhesiveness and can be a thermosetting or self-curing adhesive. For example, the first adhesive layer AD1 can be formed of an optical clear adhesive (OCA) or a pressure sensitive adhesive (PSA), but is not limited thereto.

Meanwhile, the first adhesive layer AD1 can be disposed to enclose the encapsulation layer 124 and the pixel unit 123. That is, the pixel unit 123 can be sealed by the buffer layer 122 and the encapsulation layer 124, and the encapsulation layer 124 and the pixel unit 123 can be sealed by the buffer layer 122 and the first adhesive layer AD1. The first adhesive layer AD1, together with the encapsulation layer 124 and the encapsulation substrate 125 can protect the organic light emitting element of the pixel unit 123 from external moisture, oxygen, and impacts. In this case, the first adhesive layer AD1 can further include an absorbent. The absorbent can be particles having hygroscopic properties and absorb moisture and oxygen from the outside to thereby minimize permeation of the moisture and oxygen into the pixel unit 123.

The back cover 110 is disposed on the encapsulation substrate 125. The back cover 110 is disposed to be in contact with the encapsulation substrate 125 of the display panel 120 (in the case of having no second adhesive layer AD2) and can protect the display panel 120. In order to protect the display panel 120, the back cover 110 can be formed of a material having rigidity.

A second adhesive layer AD2 is disposed between the encapsulation substrate 125 and the back cover 110. The second adhesive layer AD2 can bond the encapsulation substrate 125 and the back cover 110 to each other. The second adhesive layer AD2 is formed of a material having adhesiveness and can be a thermosetting or self-curing adhesive. For example, the second adhesive layer AD2 can be formed of an optical clear adhesive (OCA) or a pressure sensitive adhesive (PSA), but is not limited thereto.

Even though in FIG. 4, it is illustrated that the plurality of openings 111 of the back cover 110 are not filled with the second adhesive layer AD2, a portion or all of the plurality of openings 111 can be filled with the second adhesive layer AD2. If the second adhesive layer AD2 fills the plurality of openings 111 of the back cover 110, a contact area between the second adhesive layer AD2 and the back cover 110 can increase, thereby preventing a delamination phenomenon.

Further a light transmissive film can be further disposed on a front surface of the substrate 121. The light transmissive film can function to protect a front surface of the display panel 120 or to minimize reflection of external light incident onto the display panel 120. For example, the light transmissive film can be at least one film of a polyethyleneterephthalate (PET) film, an anti-reflection film, a polarizing film, and a transmittance controllable film, but is not limited thereto.

<Coupling Structure of Display Dart and Roller>

Figure 5:
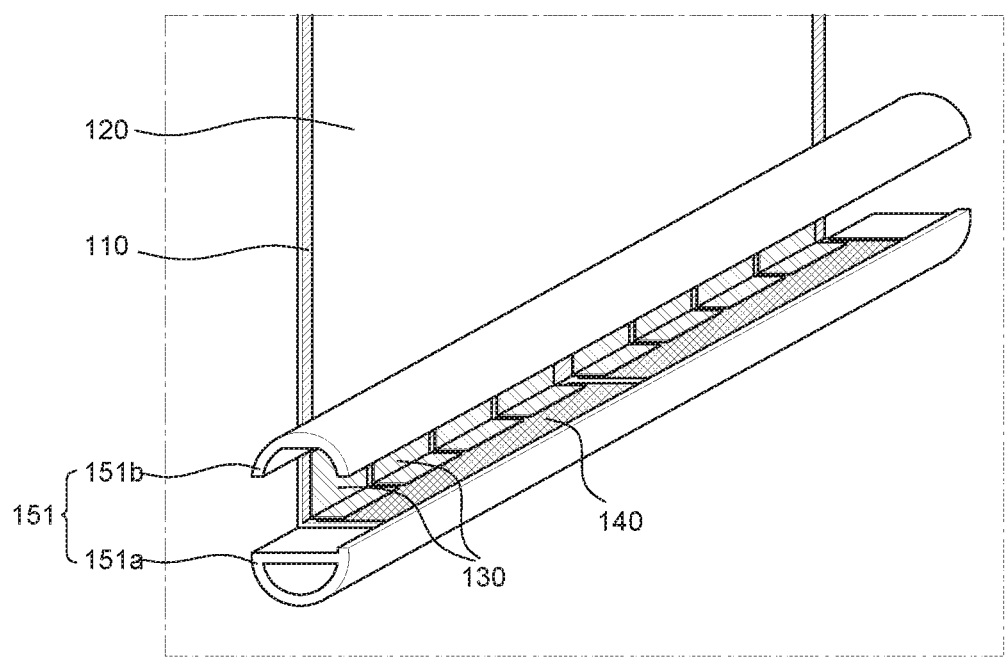
FIG. 5 is an exploded perspective view illustrating a coupling structure of a roller and the display part of the display device according to an exemplary embodiment of the present disclosure.

FIG. 5 is an exploded perspective view illustrating a coupling structure of a roller and the display part of the display device according to an exemplary embodiment of the present disclosure.

With reference to FIG. 5, the lower edge of the display part DP is fixed between the base portion 151a and the top cover 151b of the roller 151. Specifically, the fixed area FA of the back cover 110, a portion of the flexible film 130, and the printed circuit board 140 are disposed between the base portion 151a and the top cover 151b.

A portion of an outer circumferential surface of the base portion 151a is formed as a flat portion, and a remainder of the outer circumferential surface is formed as a curved portion. The flat portion of the base portion 151a can be a portion on which the fixed area FA of the back cover 110, a portion of the flexible film 130, and the printed circuit board 140 are seated. The fixed area FA is fixed to the flat portion of the base portion 151a by the plurality of second fastening holes AH2.

The top cover 151b is fastened to the flat portion of the base portion 151a. More specifically, a screw which passes through the top cover 151b of the roller 151, the fixed area FA of the back cover 110, and the base portion 151a of the roller 151 is disposed, so that the roller 151 and the fixed area FA can be fastened with each other.

In this case, an upper surface of the top cover 151b can have a convex curved shape. In addition, the curved shape of the top cover 151b can be a shape corresponding to the curved portion of the base portion 151a. Thus, a cross-section of the roller 151 after the base portion 151a and the top cover 151b are coupled can have a substantially circular shape. Accordingly, after the fixed area FA, a portion of the flexible film 130, and the printed circuit board 140 are disposed on the flat portion of the base portion 151a, the malleable area MA of the back cover 110 and the display panel 120 can be wound along the outer circumferential surface of the roller 151 having a circular shape.

Meanwhile, since the printed circuit board 140 disposed in the fixed area FA is disposed on the flat portion of the base portion 151a, it can maintain a flat state without being bent. Therefore, the printed circuit board 140 can be kept flat at all times regardless of whether the display part DP is wound or unwound, and it is feasible to prevent damage to the printed circuit board 140 according to bending of the printed circuit board 140.

<Driver>

Figure 6:
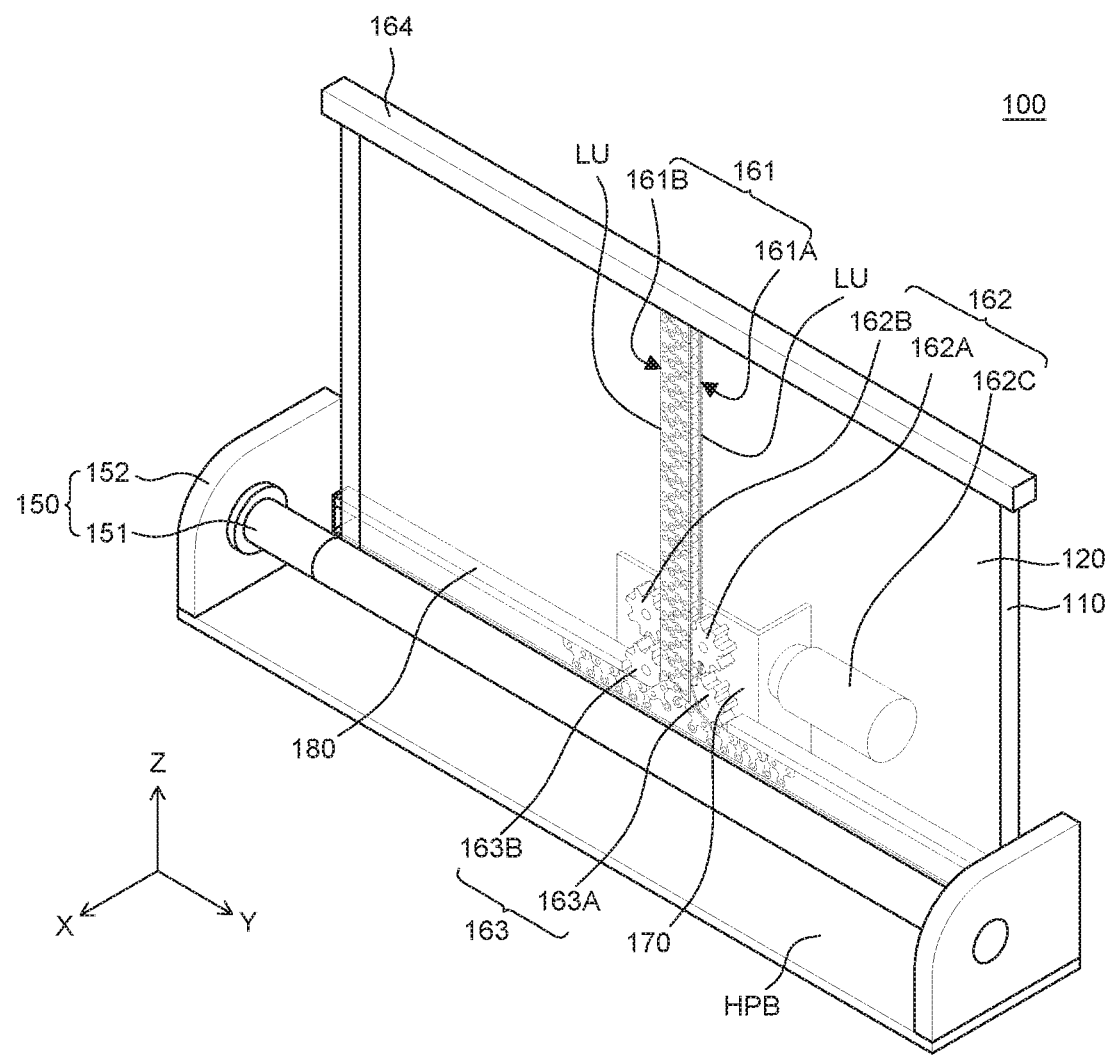
FIG. 6 is a perspective view of a driving part of the display device according to an exemplary embodiment of the present disclosure.
Figure 7:
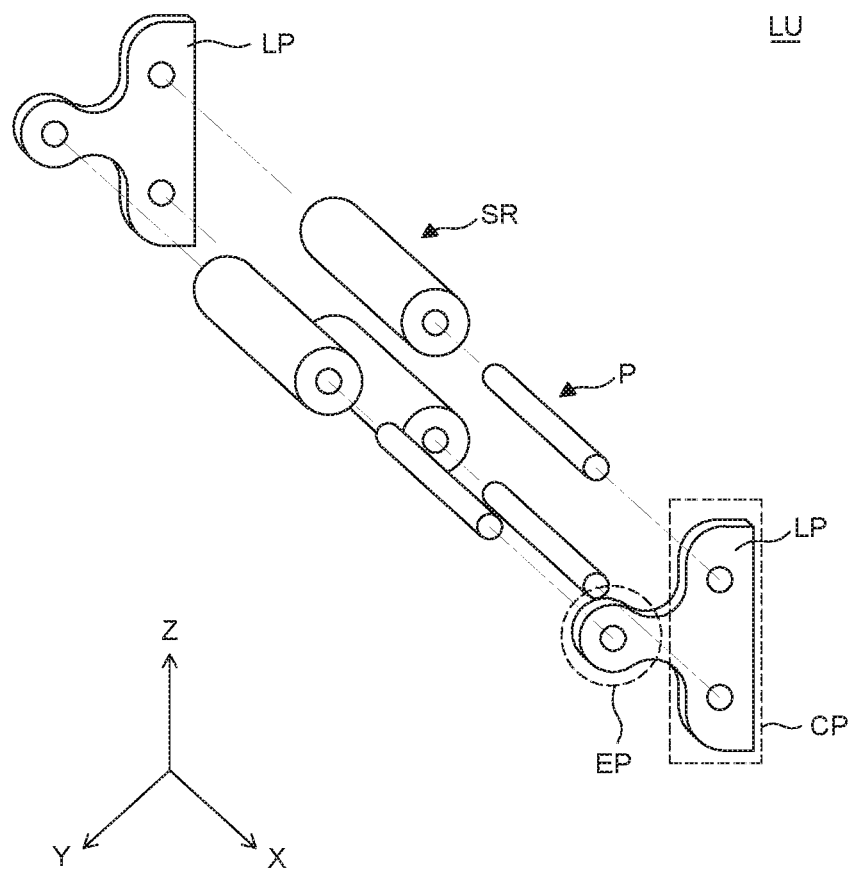
FIG. 7 is an exploded perspective view illustrating a portion of a chain unit of the display device according to an exemplary embodiment of the present disclosure.
Figure 8:
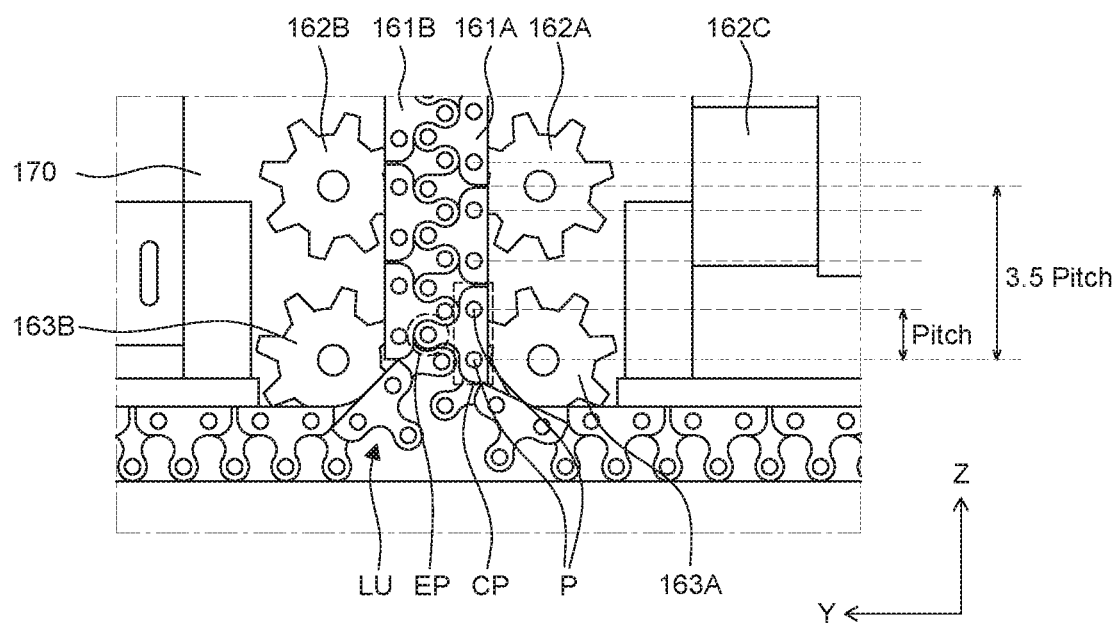
FIG. 8 is a plan view illustrating a portion of the display device according to an exemplary embodiment of the present disclosure.

FIG. 6 is a perspective view of a driving part of the display device according to an exemplary embodiment of the present disclosure. FIG. 7 is an exploded perspective view illustrating a portion of a chain unit of the display device according to an exemplary embodiment of the present disclosure. FIG. 8 is a plan view illustrating a portion of the display device according to an exemplary embodiment of the present disclosure.

First, with reference to FIG. 6, the driving part MP includes a roller unit 150 and the lifting unit 160.

The roller unit 150 is disposed inside the housing part HP and rotates clockwise or counterclockwise to wind or unwind the display part DP.

The roller unit 150 can include the roller 151 winding or unwinding the display part DP and a roller support unit 152 rotatably supporting both ends of the roller 151.

The roller 151 can include a plurality of semi-cylindrical members that can be separated from and coupled to each other. In addition, the lower edge of the display part DP can be fixed between the plurality of semi-cylindrical members.

Accordingly, when the roller 151 rotates clockwise or counterclockwise, the display part DP can be wound or unwound on the roller 151.

The roller support unit 152 is installed on a bottom surface HPB of the housing part HP, and is disposed on the both ends of the roller 151 in a longitudinal direction of the roller 151 to thereby support the roller 151. The roller 151 supported by the roller support unit 152 can be disposed to be spaced apart from the bottom surface HPB of the housing part HP by a predetermined distance. For example, the roller support unit 152 can include a bracket member installed on the bottom surface HPB of the housing part HP and a bearing member coupled to the bracket member to rotatably support the roller 151.

The lifting unit 160 is disposed in the rear of the back cover 110 in which the display panel 120 is not disposed, and can move the back cover 110 and the display panel 120 in a vertical direction, that is, in a Z-axis direction.

The lifting unit 160 includes a plurality of chain units 161 and power transmission units 162 and 163.

The plurality of chain units 161 are coupled with the head bar 164 that fixes an upper end of the display part DP thereto and support the head bar 164. The plurality of chain units 161 receive power from the power transmission units 162 and 163 and lift the head bar 164 while moving in the vertical direction.

The plurality of chain units 161 can have a zipper-type structure in which when ascending, they are engaged with and coupled to each other and move straight in the vertical direction, that is, the Z-axis direction, while when descending, they are separated from each other and move straight in a horizontal direction, that is, a Y-axis direction.

Specifically, the plurality of chain units 161 can include a first chain unit 161A and a second chain unit 161B that are disposed to face each other in the horizontal direction. Each of the first chain unit 161A and the second chain unit 161B can have a structure in which a plurality of link units LU that are engageable with each other like sawteeth are connected to each other along a longitudinal direction. Accordingly, when the power transmission units 162 and 163 provide first power to raise the first chain unit 161A and the second chain unit 161B, the first chain unit 161A and the second chain unit that are separated from each other can be engaged with and coupled to each other and can lift the head bar 164 coupled to the upper end. In addition, when the power transmission units 162 and 163 lower the first chain unit 161A and the second chain unit 161B, the first chain unit 161A and the second chain unit 161B that are coupled to each other can be separated from each other and can lower the head bar 164 coupled to the upper end. At this time, the first chain unit 161A and the second chain unit 161B that are coupled to each other can move straight in the vertical direction, and the first chain unit 161A and the second chain unit 161B that are separated from each other can move straight in the horizontal direction, that is, leftward and rightward. That is, when the display part DP is not exposed outside the housing part HP, the first chain unit 161A and the second chain unit 161B are separated leftward and rightward along a longitudinal direction of the housing part HP and can be accommodated within the housing part HP.

With reference to FIG. 7, one link unit LU can include a plurality of link plates LP disposed to face each other along a front-rear direction, that is, an X-axis direction, a plurality of pins P connecting the plurality of link plates LP, and a plurality of support rollers SR coupled to the plurality of pins P and pressed by the power transmission units 162 and 163. And, the plurality of link plates LP can include a connection portion CP that can be coupled with another link plate LP adjacent thereto along the longitudinal direction, through the pin P, and an engagement portion EP that can be engaged and coupled with the link plate LP of another link unit LU disposed to face the link unit LU along the horizontal direction, that is, the Y-axis direction. The engagement portion EP can be formed to protrude from one end of the connection portion CP in the horizontal direction, that is, in the Y-axis direction. In addition, a concave groove can be formed in the engagement portion EP so that another engagement portion EP can be seated therein. However, a shape of the engagement portion EP is not limited thereto, and can be variously changed. In addition, the pins P and the support rollers SR can be further disposed between the plurality of engagement portions EP. Therefore, as shown in FIG. 8, when the first chain unit 161A and the second chain unit 161B are coupled, they can be disposed in a state in which the plurality of engagement portions EP provided on the link plate LP of the first chain unit 161A and the plurality of engagement portions EP provided on the link plate LP of the second chain unit 161B are engaged with each other.

With reference to FIGS. 6 and 8, the power transmission units 162 and 163 are disposed in plural numbers along movement paths of the first chain unit 161A and the second chain unit 161B that are coupled to each other. In addition, in the power transmission units 162 and 163 disposed at a plurality of positions, the power transmission units 162 and 163 disposed in at least one position transmit power to the first chain unit 161A and the second chain unit 161B, thereby moving the first chain unit 161A and the second chain unit 161B. In addition, the power transmission units 162 and 163 couple or separate the first chain unit 161A and the second chain unit 161B.

The power transmission units 162 and 163 include a first power transmission unit 162 and a second power transmission unit 163.

The first power transmission unit 162 is disposed above the second power transmission unit 163 in the vertical direction, that is, the Z-axis direction, and transmits power to the first chain unit 161A and the second chain unit 161B to thereby lift or lower the first chain unit 161A and the second chain unit 161B. At this time, the first power transmission unit 162 can be disposed in a position in which the first chain unit 161A and the second chain unit 161B are coupled to each other. That is, the first power transmission unit 162 is disposed on both sides of the first chain unit 161A and the second chain unit 161B that are coupled to each other. And, the first power transmission unit 162 transmits power to the first chain unit 161A and the second chain unit 161B so that the first chain unit 161A and the second chain unit 161B can move straight in the vertical direction.

The first power transmission unit 162 can further include a plurality of driving sprockets and a motor 162C that transmits power to the plurality of driving sprockets.

The plurality of driving sprockets can include a first driving sprocket 162A and a second driving sprocket 162B.

The first driving sprocket 162A is coupled to the first chain unit 161A and generates rotational force to thereby transmit power to the first chain unit 161A. For example, the first driving sprocket 162A can be disposed in a rotatable state on a guide frame 170. In addition, a plurality of sawtooth members can be formed around the first driving sprocket 162A. The plurality of sawtooth members are coupled to the first chain unit 161A to press the first chain unit 161A. Further, an end portion of the first driving sprocket 162A which is coupled with the motor 162C can further be provided with a gear-shaped member that can rotate in engagement with a gear provided at a front end of the motor 162C.

The second driving sprocket 162B is disposed to face the first driving sprocket 162A in the horizontal direction, that is, in the Y-axis direction, and may be coupled with the second chain unit 161B. Further, the second driving sprocket 162B can generate rotational force and transmit power to the second chain unit 161B. At this time, the second driving sprocket 162B can rotate in a direction opposite to a rotational direction of the first driving sprocket 162A to thereby transmit power to the second chain unit 161B. For example, the second driving sprocket 162B can be disposed in a rotatable state on the guide frame 170. In addition, a plurality of sawtooth members can be formed around the second driving sprocket 162B. The plurality of sawtooth members are coupled to the second chain unit 161B to press the second chain unit 161B. Further, an end portion of the second driving sprocket 162B which is coupled with the motor 162C can further be provided with a gear-shaped member that can rotate in engagement with the gear provided at the front end of the motor 162C.

The motor 162C is installed on the guide frame 170 and is coupled to the first driving sprocket 162A or the second driving sprocket 162B. The motor 162C is supplied with power from the outside or supplied with power through a built-in battery or the like, and transmits power directly to the first driving sprocket 162A or the second driving sprocket 162B. Accordingly, one driving sprocket that does not receive power directly from the motor 162C, and a plurality of driven sprockets, receive power by the first chain unit 161A and the second chain unit 161B to thereby be driven. For example, when the motor 162C directly transmits power to the first driving sprocket 162A, the second driving sprocket 162B and a plurality of first and second driven sprockets 163A and 163B receive power from the first chain unit 161A and the second chain unit 161B driven by the first driving sprocket 162A. However, the motor 162C is not necessarily coupled to the first driving sprocket 162A or the second driving sprocket 162B, and if necessary, it can also be coupled to the first driven sprocket 163A or the second driven sprocket 163B of the second power transmission unit 163.

The second power transmission unit 163 is disposed below the first power transmission unit 162 in the vertical direction, that is, the Z-axis direction, and is coupled with the first chain unit 161A and the second chain unit 161B. And, the second power transmission unit 163 rotates the first chain unit 161A and the second chain unit 161B and thus, switch movement directions of the first chain unit 161A and the second chain unit 161B, so that the first chain unit 161A and the second chain unit 161B are coupled to or separated from each other. Specifically, the second power transmission unit 163 is disposed below the first power transmission unit 162, and is connected to the first power transmission unit 162 through the first chain unit 161A and the second chain unit 161B. In addition, the second power transmission unit 163 receives power from the first chain unit 161A and the second chain unit 161B driven by the first power transmission unit 162 and generates rotational force. Accordingly, the second power transmission unit 163 rotates the first chain unit 161A and the second chain unit 161B, thereby switching the movement directions of the first chain unit 161A and the second chain unit 161B. Therefore, when the first chain unit 161A and the second chain unit 161B move upwardly, the movement directions of the first chain unit 161A and the second chain unit 161B that are separated leftward and rightward with respect to a place where the first chain unit 161A and the second chain unit 161B are coupled, can be switched by the second power transmission unit 163. In other words, when the first chain unit 161A and the second chain unit 161B move upwardly, the movement directions of the first chain unit 161A and the second chain unit 161B that are separated from each other in the horizontal direction, that is, in the Y-axis direction, with respect to the place where the first chain unit 161A and the second chain unit 161B are coupled to each other, can be switched by the second power transmission unit 163. Accordingly, the first chain unit 161A and the second chain unit 161B are engaged with and coupled to each other. In addition, when the first chain unit 161A and the second chain unit 161B move downwardly, the movement directions of the first chain unit 161A and the second chain unit 161B that are engaged with and coupled to each other can be switched by the second power transmission unit 163, whereby the first chain unit 161A and the second chain unit 161B are separated leftward and rightward.

The second power transmission unit 163 can include the first driven sprocket 163A and the second driven sprocket 163B.

The first driven sprocket 163A can be disposed below the first driving sprocket 162A in the vertical direction and coupled with the first chain unit 161A. Further, the first driven sprocket 163A can generate rotational force by receiving power from the first chain unit 161A. Accordingly, the first driven sprocket 163A can switch the movement direction of the first chain unit 161A to couple or separate the first chain unit 161A to or from the second chain unit 161B. At this time, a portion of the first chain unit 161A which is engaged with the first driven sprocket 163A can be disposed in a bent state along a rotational direction of the first driven sprocket 163A. For example, the first driven sprocket 163A can be disposed in a rotatable state on the guide frame 170. In addition, a plurality of sawtooth members can be formed around the first driven sprocket 163A. The plurality of sawtooth members are coupled to the first chain unit 161A to press the first chain unit 161A.

The second driven sprocket 163B is disposed to face the first driven sprocket 163A in the horizontal direction and is disposed below the second driving sprocket 162B in the vertical direction to be coupled with the second chain unit 161B. In addition, the second driven sprocket 163B can receive power from the second chain unit 161B and generate rotational force. Thus, the second driven sprocket 163B can switch the movement direction of the second chain unit 161B to thereby couple or separate the second chain unit 161B to or from the first chain unit 161A. At this time, the second driven sprocket 163B can rotate in a direction opposite to the rotational direction of the first driven sprocket 163A and transmit power to the second chain unit 161B. In addition, a portion of the second chain unit 161B which is engaged with the second driven sprocket 163B can be disposed in a bent state along the rotational direction of the second driven sprocket 163B. For example, the second driven sprocket 163B can be disposed in a rotatable state on the guide frame 170. In addition, a plurality of sawtooth members can be formed around the second driven sprocket 163B. The plurality of sawtooth members are coupled to the second chain unit 161B to press the second chain unit 161B.

With reference to FIGS. 7 and 8, the first driving sprocket 162A and the second driving sprocket 162B are disposed at positions spaced apart from the first driven sprocket 163A and the second driven sprocket 163B by a predetermined distance or more. Specifically, when it is assumed that a distance between the plurality of pins P disposed in the connection portion CP of the link unit LU is 1 pitch, the first driving sprocket 162A and the second driving sprocket 162B can be disposed at positions spaced apart by three pitches or more from the first driven sprocket 163A and the second driven sprocket 163B. For example, the first driving sprocket 162A and the second driving sprocket 162B can be disposed at a distance of 3.5 pitch from the first driven sprocket 163A and the second driven sprocket 163B. At this time, a center of the first driving sprocket 162A and a center of the second driving sprocket 162B can be collinearly disposed, and a center of the first driven sprocket 163A and a center of the second driven sprocket 163B can be collinearly disposed.

With reference to FIG. 6, the lifting unit 160 can further include the head bar 164.

The head bar 164 fixes the upper end of the display part DP thereto and is coupled to upper ends of the first chain unit 161A and the second chain unit 161B that are combined with each other to thereby move together with the first chain unit 161A and the second chain unit 161B. Therefore, the head bar 164 can lift or lower the display part DP in the vertical direction, that is, in the Z-axis direction, by the first chain unit 161A and the second chain unit 161B. For example, the head bar 164 is fixed to the support area PA of the back cover 110 and can be disposed to cover only a portion of a surface adjacent to a top edge of the back cover 110 so as not to cover an image displayed on the front surface of the display panel 120.

The display device 100 can further include the guide frame 170 and guide rails 180.

With reference to FIG. 6, the guide frame 170 is disposed in the rear of the first chain unit 161A and the second chain unit 161B along a front-rear direction, that is, an X-axis direction, and can support the first power transmission unit 162 and the second power transmission unit 163.

The guide rails 180 are disposed in front of the guide frame 170 and can guide the first chain unit 161A and the second chain unit 161B that are separated by the second power transmission unit 163, in the horizontal direction, that is, in the Y-axis direction. Specifically, the guide rails 180 can be disposed on a left side and a right side of the first chain unit 161A and the second chain unit 161B, respectively, in the horizontal direction, based on the first chain unit 161A and the second chain unit 161B that are coupled to each other. And, guide grooves in which the first chain unit 161A and the second chain unit 161B separated from each other are accommodated and through which the first chain unit 161A and the second chain unit 161B can be guided in the horizontal direction, can be formed in the guide rails 180.

In the display device 100 according to an exemplary embodiment of the present disclosure, the plurality of driving sprockets 162A and 162B that transmit power to the plurality of chain units 161 coupled to each other can be disposed above the plurality of driven sprockets 163A and 163B that couple or separate the first chain unit 161A and the second chain unit 161B. Therefore, it is feasible to prevent wobbles in the front-rear direction and the horizontal direction due to tolerances between components when driving the first chain unit 161A and the second chain unit 161B, and durability of the display device 100 can be improved.

In addition, in the display device 100 according to an exemplary embodiment of the present disclosure, as the wobbles in the front-rear direction and the horizontal direction decrease, it is feasible to implement a stable rollable display device, thereby allowing for improvements in reliability of the display device 100.

In addition, in the display device 100 according to an exemplary embodiment of the present disclosure, power of the motor 162C can be transmitted to the first chain unit 161A and the first chain unit 161A that are disposed to be coupled to each other, through the plurality of driving sprockets 162A and 162B. Accordingly, when the power of the motor 162C is transmitted to the plurality of driven sprockets 163A and 163B, the wobbles in the horizontal direction and backlash generated between the plurality of driven sprockets 163A and 163B and the plurality of chain units 161A and 161B can be prevented.

<Guide Structure 1 of Chain Units>

Figure 9:
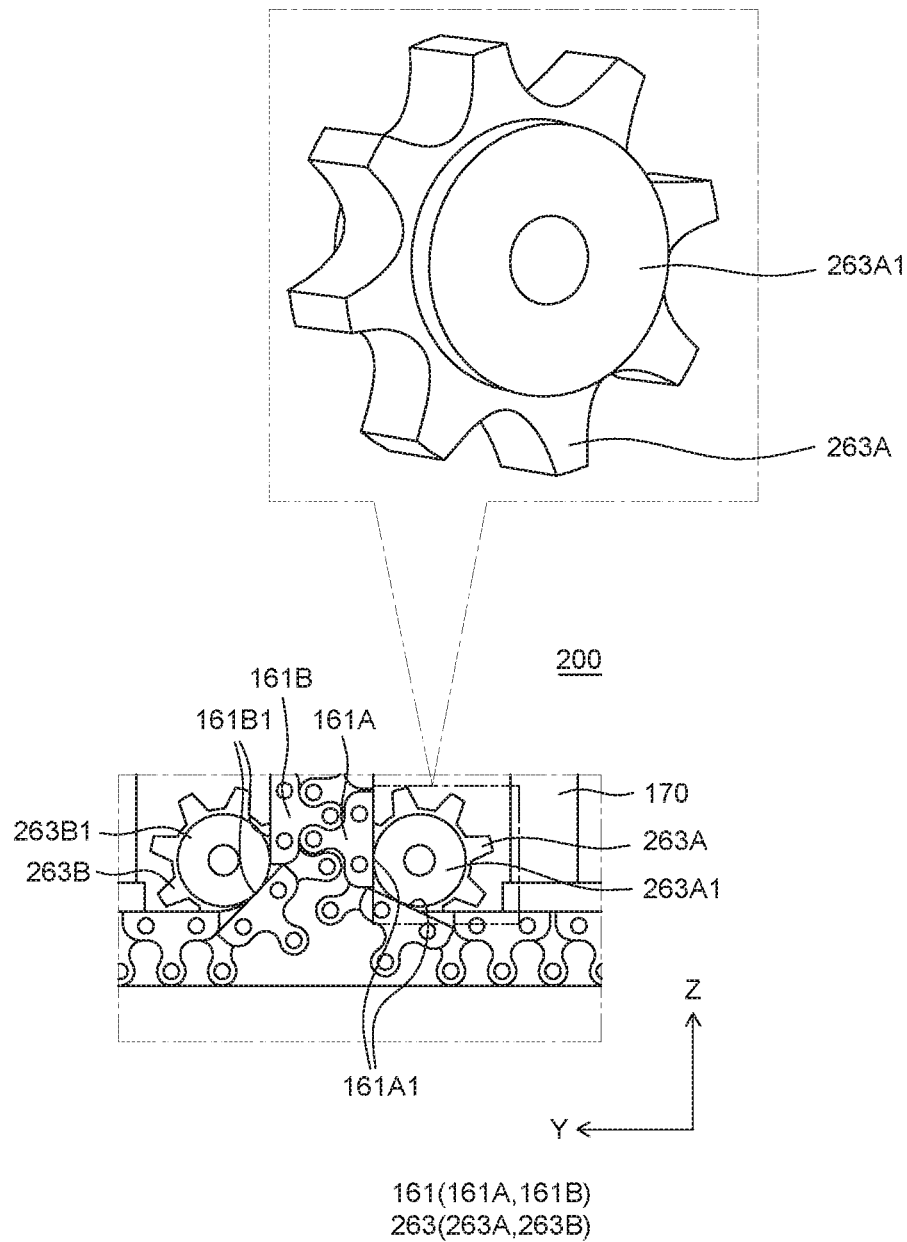
FIG. 9 is a plan view illustrating a portion of a display device according to another exemplary embodiment of the present disclosure.

FIG. 9 is a plan view illustrating a portion of a display device according to another exemplary embodiment of the present disclosure. In FIG. 9, only a portion of a display device 200 is illustrated. The display device 200 illustrated in FIG. 9 is substantially the same as the display device 100 illustrated in FIGS. 1 to 8, except for a second power transmission unit 263. Thus, a duplicate description is omitted.

With reference to FIG. 9, the second power transmission unit 263 is coupled with the first chain unit 161A and the second chain unit 161B. The second power transmission unit 263 rotates the first chain unit 161A and the second chain unit 161B to thereby switch the movement directions of the first chain unit 161A and the second chain unit 161B, so that the first chain unit 161A and the second chain unit 161B are coupled to or separated from each other.

The second power transmission unit 263 can include a first driven sprocket 263A and a second driven sprocket 263B.

The first driven sprocket 263A is coupled to the first chain unit 161A and receives power from the first chain unit 161A to generate rotational force. Accordingly, the first driven sprocket 263A can switch the movement direction of the first chain unit 161A to couple or separate the first chain unit 161A to or from the second chain unit 161B. At this time, a portion of the first chain unit 161A which is engaged with the first driven sprocket 263A can be disposed in a bent state along a rotational direction of the first driven sprocket 263A. For example, the first driven sprocket 263A can be disposed in a rotatable state on the guide frame 170. In addition, a plurality of sawtooth members can be formed around the first driven sprocket 263A. The plurality of sawtooth members are coupled to the first chain unit 161A to press the first chain unit 161A.

The second driven sprocket 263B is disposed to face the first driven sprocket 263A in a horizontal direction, and can be coupled with the second chain unit 161B. Further, the second driven sprocket 263B can receive power from the second chain unit 161B and generate rotational force. Accordingly, the second driven sprocket 263B can switch the movement direction of the second chain unit 161B to couple or separate the second chain unit 161B to or from the first chain unit 161A. At this time, the second driven sprocket 263B can rotate in a direction opposite to the rotational direction of the first driven sprocket 263A to thereby transmit power to the second chain unit 161B. In addition, a portion of the second chain unit 161B which is engaged with the second driven sprocket 263B can be disposed in a bent state along the rotational direction of the second driven sprocket 263B. For example, the second driven sprocket 263B can be disposed in a rotatable state on the guide frame 170. In addition, a plurality of tooth members can be formed around the second driven sprocket 263B.

The plurality of tooth members are coupled to the second chain unit 161B to press the second chain unit 161B.

Also, the second power transmission unit 263 can rotate the plurality of chain units 161, while supporting side surfaces 161A1 and 161B1 of the plurality of chain units 161.

Specifically, a guide boss 263A1 supporting the side surface 161A1 of the first chain unit 161A is formed on the first driven sprocket 263A, and a guide boss 263B1 supporting the side surface 161B1 of the second chain unit 161B is formed on the second driven sprocket 263B.

The guide boss 263A1 can be formed to protrude from one surface of the first driven sprocket 263A by a predetermined distance along an axial direction of the first driven sprocket 263A. Further, the guide boss 263A1 can be formed in a cylindrical shape having an outer circumferential surface. Accordingly, the side surface 161A1 of the first chain unit 161A which is rotated by the first driven sprocket 263A can be supported on an outer circumferential surface of the guide boss 263A1. Accordingly, a portion of the first chain unit 161A which rotates in engagement with the first driven sprocket 263A is bent in a curved shape along the outer circumferential surface of the guide boss 263A1.

The guide boss 263B1 formed on the second driven sprocket 263B can have the same shape as the guide boss 263A1 formed on the first driven sprocket 263A.

In the display device 200 according to another exemplary embodiment of the present disclosure, the guide bosses 263A1 and 263B1 that support the side surfaces 161A1 and 161B1 of the plurality of chain units 161 on the first driven sprocket 263A and the second driven sprocket 263B, respectively, and correct positions of the plurality of chain units 161 when rotating the plurality of chain units 161 are formed. Accordingly, a portion of the first chain unit 161A and the second chain unit 161B that are coupled to the first driven sprocket 263A and the second driven sprocket 263B is accurately guided in the rotational directions of the first driven sprocket 263A and the second driven sprocket 263B to thereby prevent shaking of the plurality of chain units 161 and prevent separation of the plurality of chain units 161, so that wobbling of the display device 200 can be prevented.

<Guide Structure 2 of Chain Units>

Figure 10:
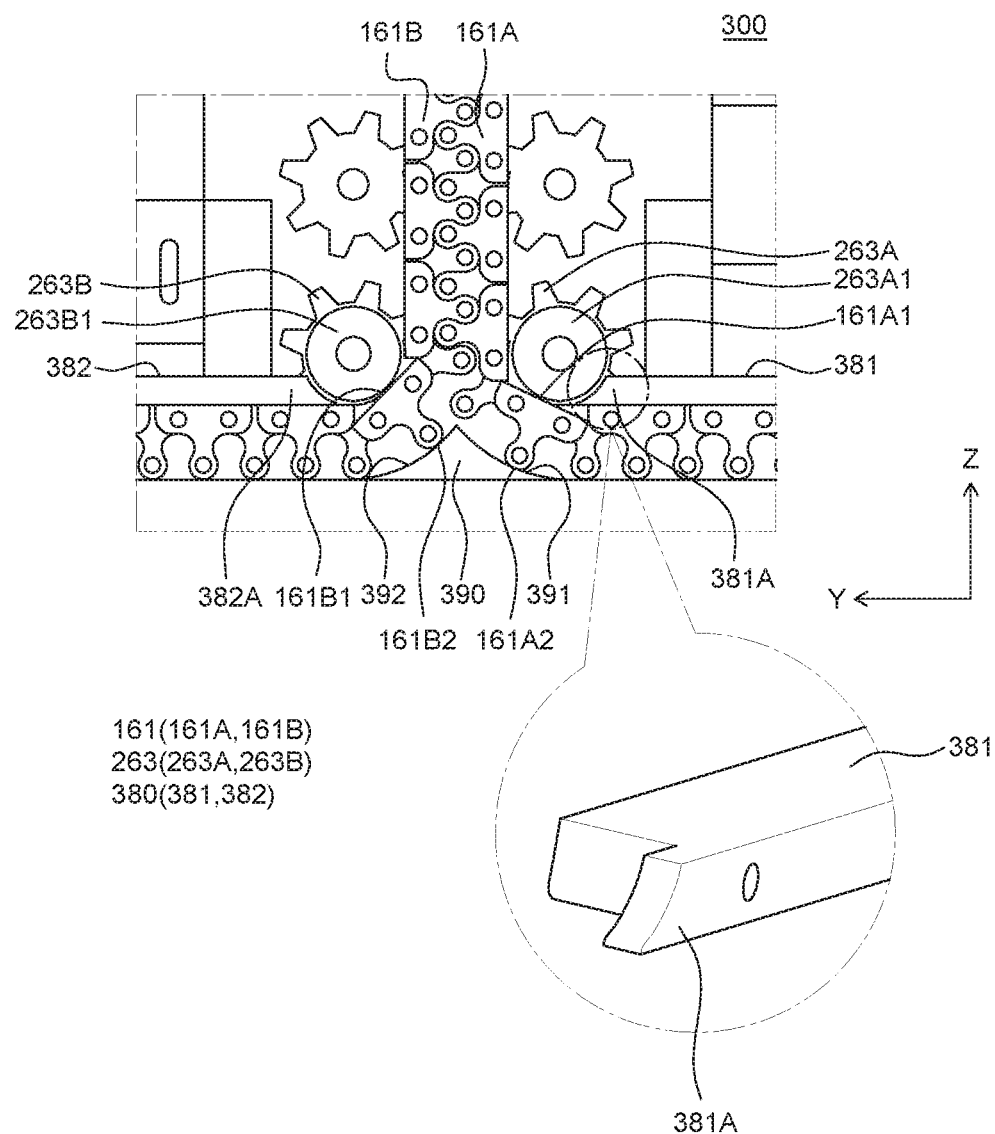
FIG. 10 is a plan view illustrating a portion of a display device according to still another exemplary embodiment of the present disclosure.

FIG. 10 is a plan view illustrating a portion of a display device according to still another exemplary embodiment of the present disclosure. In FIG. 10, only a portion of a display device 300 is illustrated. The display device 300 shown in FIG. 10 is substantially the same as the display device 200 shown in FIG. 9, except for guide rails 380 and a rotation guide unit 390, and thus, a duplicate description is omitted.

With reference to FIG. 10, the guide rails 380 are coupled to the second power transmission unit 263. The guide rails 380 can separate the plurality of chain units 161 which are rotated by the second power transmission unit 263, from the second power transmission unit 263, and guide the separated plurality of chain units 161 in a horizontal direction, that is, in a Y-axis direction.

The guide rail 380 can include a first guide rail 381 and a second guide rail 382.

The first guide rail 381 can be disposed on a right side of the first chain unit 161A and the second chain unit 161B that are coupled to each other in the horizontal direction, based on the first chain unit 161A and the second chain unit 161B that are coupled to each other. In addition, the first guide rail 381 can separate the first chain unit 161A which rotates while being supported by the guide boss 263A1 of the first driven sprocket 263A, from the guide boss 263A1 of the first driven sprocket 263A, and guide the separated first chain unit 161A rightward. At this time, a wedge-shaped separation portion 381A separating the first chain unit 161A which is rotated along the outer circumferential surface of the guide boss 263A1, from the guide boss 263A1, can be provided at an end portion of the first guide rail 381 facing the outer circumferential surface of the guide boss 263A1. The separation portion 381A can be disposed between the first chain unit 161A which is rotated along the outer circumferential surface of the guide boss 263A1, and the guide boss 263A1 of the first driven sprocket 263A. The separation portion 381A can be disposed at a position spaced apart from the guide boss 263A1 of the first driven sprocket 263A by a predetermined distance so as not to interfere with the guide boss 263A1 of the first driven sprocket 263A. In addition, the separation portion 381A can have a shape corresponding to the outer circumferential surface of the guide boss 263A1 in such a manner that it can be disposed at a position as close as possible to the guide boss 263A1 of the first driven sprocket 263A, while not interfering with the guide boss 263A1 of the first driven sprocket 263A. Specifically, an end portion of the separation portion 381A facing the outer circumferential surface of the guide boss 263A1 can be formed in a curved shape corresponding to the outer circumferential surface of the guide boss 263A1.

The second guide rail 382 can be disposed on a left side of the first chain unit 161A and the second chain unit 161B that are coupled to each other in the horizontal direction, based on the first chain unit 161A and the second chain unit 161B that are coupled to each other. In addition, the second guide rail 382 can separate the second chain unit 161B which rotates while being supported by the guide boss 263B1 of the second driven sprocket 263B, from the guide boss 263B1 of the second driven sprocket 263B, and guide the separated second chain unit 161B leftward. At this time, a wedge-shaped separation portion 382A separating the second chain unit 161B which is rotated along an outer circumferential surface of the guide boss 263B1, from the guide boss 263B1, can be provided at an end portion of the second guide rail 382 facing the outer circumferential surface of the guide boss 263B1. The separation portion 382A can be disposed between the second chain unit 161B which is rotated along the outer circumferential surface of the guide boss 263B1, and the guide boss 263B1 of the second driven sprocket 263B. The separation portion 382A can be disposed at a position spaced apart from the guide boss 263B1 of the second driven sprocket 263B by a predetermined distance so as not to interfere with the guide boss 263B1 of the second driven sprocket 263B. In addition, the separation portion 382A can have a shape corresponding to the outer circumferential surface of the guide boss 263B1 in such a manner that it can be disposed at a position as close as possible to the guide boss 263B1 of the second driven sprocket 263B, while not interfering with the guide boss 263B1 of the second driven sprocket 263B. Specifically, an end portion of the separation portion 382A facing the outer circumferential surface of the guide boss 263B1 can be formed in a curved shape corresponding to the outer circumferential surface of the guide boss 263B1.

The driving part MP can further include the rotation guide unit 390.

With reference to FIG. 10, the rotation guide unit 390 can be disposed between the first guide rail 381 and the second guide rail 382 along the horizontal direction, that is, the Y-axis direction. In addition, a plurality of rotation guide surfaces 391 and 392 can be formed on the rotation guide unit 390. The plurality of rotation guide surfaces 391 and 392 guide the plurality of chain units 161 which are rotated by the second power transmission unit 263, in the rotational direction of the second power transmission unit 263. The plurality of rotation guide surfaces 391 and 392 can include a first rotation guide surface 391 which guides the other side surface 161A2 of the first chain unit 161A, and a second rotation guide surface 392 which guides the other side surface 161B2 of the second chain unit 161B. For example, the first rotation guide surface 391 and the second rotation guide surface 392 can have a curved shape.

Therefore, the rotation guide unit 390 disposed between the first guide rail 381 and the second guide rail 382 can guide, the other side surface 161A2 of the first chain unit 161A which rotates in a state in which one side surface 161A1 thereof is supported by the guide boss 263A1 of the first driven sprocket 263A, in the rotational direction of the first driven sprocket 263A through the first rotation guide surface 391. And, the rotation guide unit 390 disposed between the first guide rail 381 and the second guide rail 382 can guide, the other side surface 161B2 of the second chain unit 161B which rotates in a state in which one side surface 161B1 thereof is supported by the guide boss 263B1 of the second driven sprocket 263B, in the rotational direction of the second driven sprocket 263B through the second rotation guide surface 392.

In the display device 300 according to still another exemplary embodiment of the present disclosure, the wedge-shaped separation portions 381A and 382A that separate the chain units 161A and 161B rotating while being supported by the guide bosses 263A1 and 263B1 of the driven sprockets 263A and 263B from the guide bosses 263A1 and 263B1 and guide the separated chain units 161A and 161B to the guide rails 381 and 382 can be provided at the end portions of the guide rails 381 and 382. Accordingly, the chain units 161A and 161B rotated on the driven sprockets 263A and 263B can enter the guide rails 380 more easily. Therefore, in the display device 300 according to another exemplary embodiment of the present disclosure, since it is feasible to prevent the driven sprockets 263A and 263B and the end portions of the guide rails 381 and 382 from interfering with each other and to stably move the chain units 161A and 161B, wobbling of the display device 300 can be prevented.

In addition, in the display device 300 according to still another exemplary embodiment of the present disclosure, the rotation guide unit 390 is disposed between the plurality of guide rails 381 and 382. Accordingly, the rotation guide unit 390 guides the other side surfaces 161A2 and 161B2 of the chain units 161A and 161B that are rotated by the driven sprockets 263A and 263B, thereby preventing separation of the chain units 161A and 161B during rotation, and allowing for more stable movements of the chain units 161A and 161B, so that wobbling of the display device 300 can be prevented.

<Guide Structure 3 of Chain Units>

Figure 11:
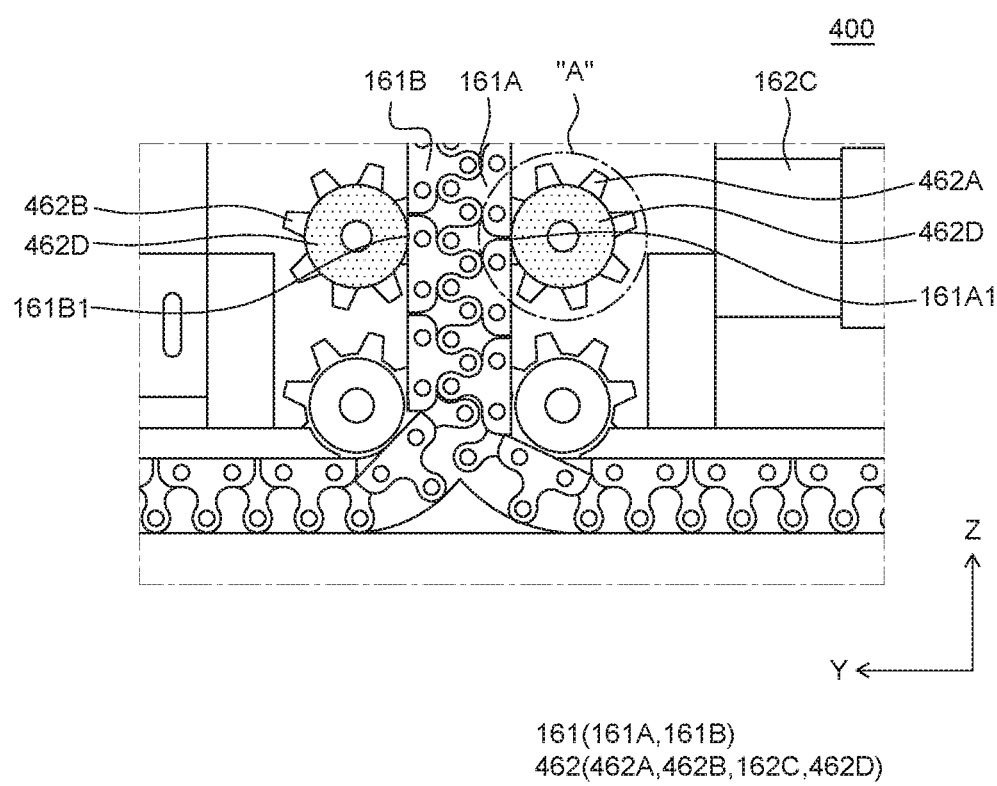
FIG. 11 is a plan view illustrating a portion of a display device according to still another exemplary embodiment of the present disclosure.
Figure 12:
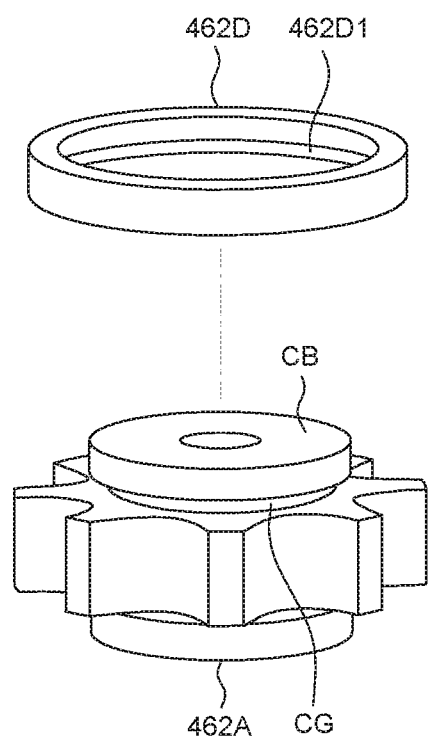
FIG. 12 is an exploded perspective view illustrating a portion "A" of FIG. 11.

FIG. 11 is a plan view illustrating a portion of a display device according to still another exemplary embodiment of the present disclosure. FIG. 12 is an exploded perspective view illustrating a portion "A" of FIG. 11. A display device 400 shown in FIG. 11 is substantially the same as the display device 300 shown in FIG. 10 except for a plurality of driving sprockets 462A and 462B and support members 462D. Thus, a duplicated description is omitted.

With reference to FIG. 11, the first power transmission unit 162 can transmit power to the plurality of chain units 161 while supporting the side surfaces 161A1 and 161B1 of the plurality of chain units 161. Specifically, the first power transmission unit 162 can transmit power to the first chain unit 161A and the second chain unit 161B, while supporting the side surface 161A1 of the first chain unit 161A and the side surface 161B1 of the second chain unit 161B to thereby lift the first chain unit 161A and the second chain unit 161B.

The first power transmission unit 162 can further include the support members 462D.

The support members 462D can be coupled to the first driving sprocket 462A and the second driving sprocket 462B, respectively, and support the side surface 161A1 of the first chain unit 161A and the side surface 161B1 of the second chain unit 161B. And, the support members 462D can be rotated by the first driving sprocket 462A and the second driving sprocket 462B and guide the first chain unit 161A and the second chain unit 161B in a vertical direction, that is, in a Z-axis direction.

With reference to FIGS. 11 and 12, the support members 462D are formed in a circular ring shape and coupled to outer surfaces of the first driving sprocket 462A and the second driving sprocket 462B, and can support the side surface 161A1 of the first chain unit 161A and the side surface 161B1 of second chain unit 461B through outer circumferential surfaces thereof. In addition, a coupling protrusion 462D1 can be formed on inner circumferential surfaces of the support members 462D for coupling with the first driving sprocket 462A and the second driving sprocket 462B. For example, the support member 462D can be formed of a rubber or silicone material having elasticity. However, the material of the support member 462D is not necessarily limited thereto, and can be changed with various materials. Meanwhile, a coupling boss CB to which the support member 462D can be coupled can be formed on the first driving sprocket 462A. The coupling boss CB can be formed to protrude from one surface of the first driving sprocket 462A by a predetermined distance along an axial direction. In addition, the coupling boss CB is formed in a cylindrical shape, and a coupling groove CG to which the coupling protrusion 462D1 of the support member 462D can be coupled can be formed on an outer circumferential surface of the coupling boss CB. Although not specifically shown in the drawings, in the second driving sprocket 462B, the same coupling boss CB and the coupling groove CG as those of the first driving sprocket 462A can be formed.

In the display device 400 according to still another exemplary embodiment of the present disclosure, the support members 462D supporting the side surface 161A1 of the first chain unit 161A and the side surface 161B1 of the second chain unit 161B can be disposed on the first driving sprocket 462A and the second driving sprocket 462B that receive power of the motor 162C and transmit the power to the first chain unit 161A and the second chain unit 161B during a period in which the first chain unit 161A and the second chain unit 161B are coupled to each other and move in a linear motion. Accordingly, in the display device 400 according to still another exemplary embodiment of the present disclosure, the backlash between the driving sprockets 462A and 462B and the chain units 161A and 161B can be removed, and shaking of the chain units 161A and 161B in the horizontal direction can be prevented.

<Guide Structure 4 of Chain Units>

Figure 13:
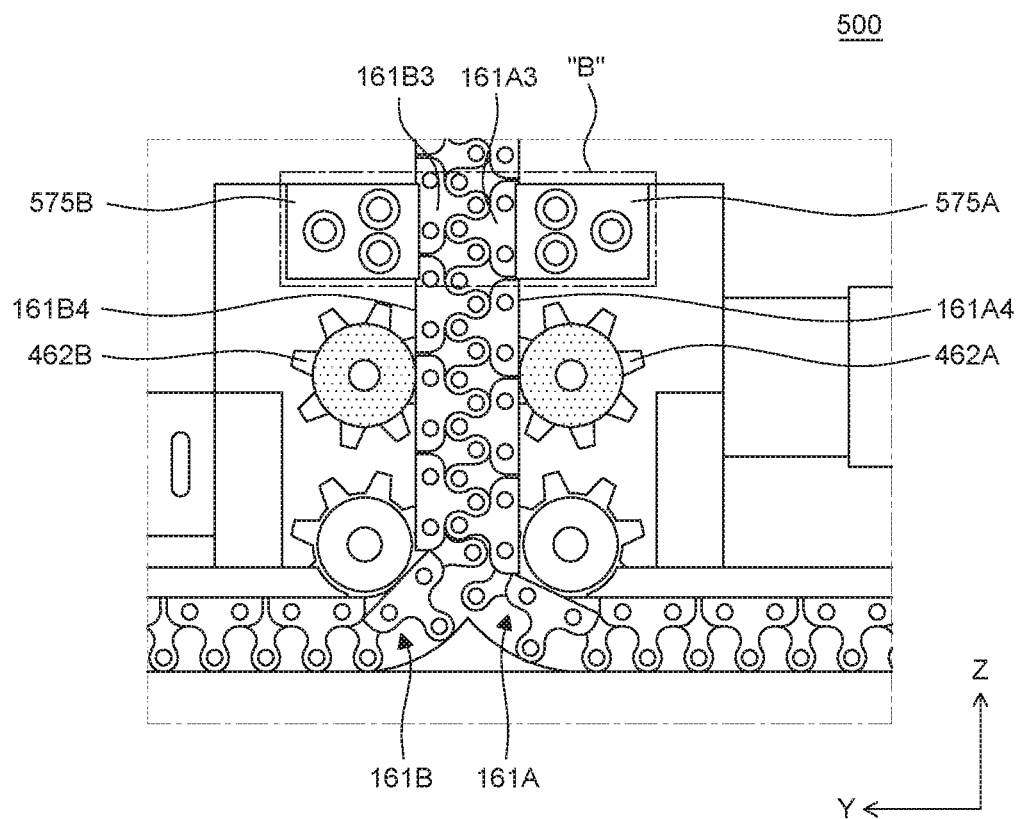
FIG. 13 is a plan view illustrating a portion of a display device according to still another exemplary embodiment of the present disclosure.
Figure 14:
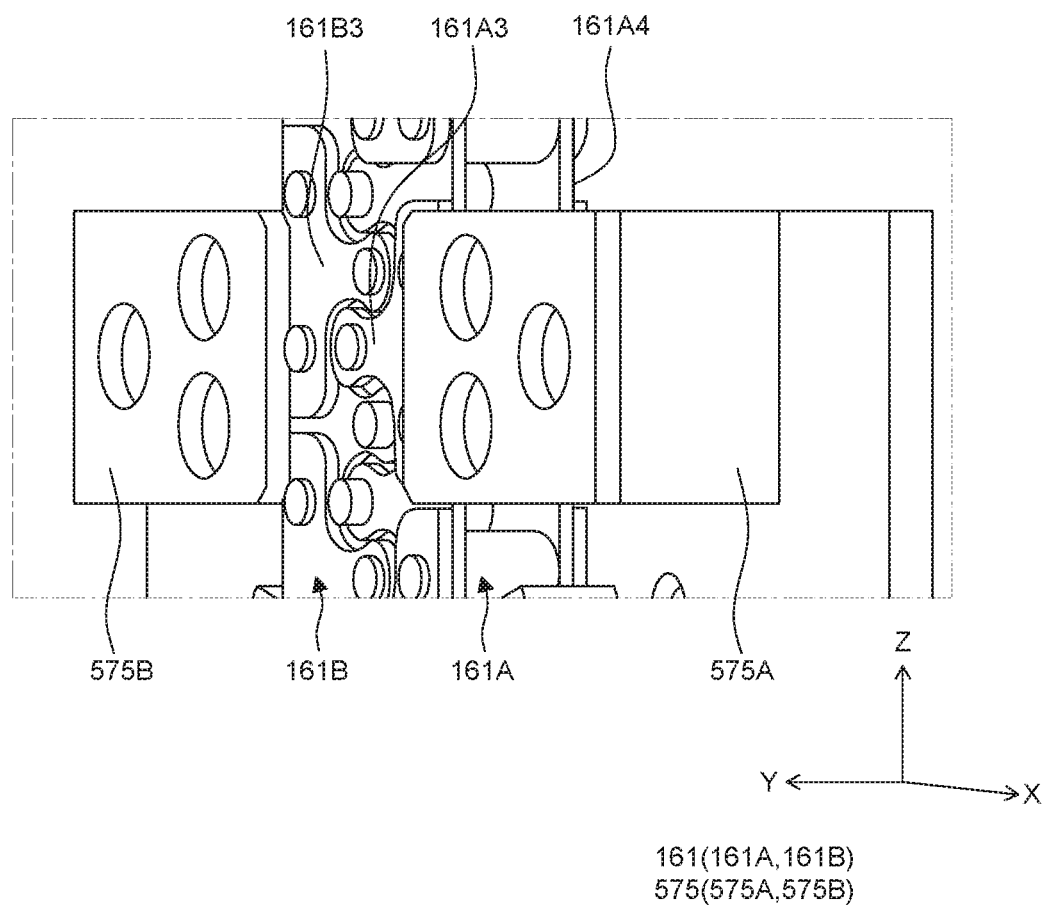
FIG. 14 is a perspective view illustrating a portion "B" of FIG. 13.

FIG. 13 is a plan view illustrating a portion of a display device according to still another exemplary embodiment of the present disclosure. FIG. 14 is a perspective view illustrating a portion "B" of FIG. 13. A display device 500 illustrated in FIG. 13 is substantially the same as the display device 400 illustrated in FIG. 11, except for support blocks 575, and thus, a duplicate description is omitted.

With reference to FIGS. 13 and 14, the display device 500 can further include the support blocks 575.

The support blocks 575 can support front surfaces 161A3 and 161B3 and rear surfaces 161A4 and 161B4 of the plurality of chain units 161 in positions where the plurality of chain units 161 are coupled to each other and move straight in a vertical direction, that is, in a Z-axis direction.

The support blocks 575 can include a first support block 575A and a second support block 575B.

Specifically, the support blocks 575 can include a first support block 575A and a second support block 575B. The first support block 575A is disposed on a side portion of the first chain unit 161A in a horizontal direction, that is, in a Y-axis direction, and disposed above the first driving sprocket 462A in the vertical direction, and supports the front surface 161A3 and the rear surface 161A4 of the first chain unit 161A. The second support block 575B is disposed on a side portion of the second chain unit 161B in the horizontal direction and disposed above the second driving sprocket 462B in the vertical direction, and supports the front surface 161B3 and the rear surface 161B4 of the second chain unit 161B.

The first support block 575A can have a structure capable of accommodating a portion of the first chain unit 161A therein and supporting the front surface 161A3 and the rear surface 161A4 of the first chain unit 161A through a plurality of support surfaces facing each other. For example, the first support block 575A can include a first member supporting the front surface 161A3 of the first chain unit 161A, a second member supporting the rear surface 161A4 of the first chain unit 161A, and a connection member disposed between the first member and the second member to support the first member and the second member. At this time, a distance between the first member and the second member where a portion of the first chain unit 161A is accommodated, that is, a thickness of the connection member can be equal to a distance between the front surface 161A3 and the rear surface 161A4 of the first chain unit 161A.

The second support block 575B can have the same shape as the first support block 575A. That is, the second support block 575B can have a structure capable of accommodating a portion of the second chain unit 161B therein and supporting the front surface 161B3 and the rear surface 161B4 of the second chain unit 161B through a plurality of support surfaces facing each other.

In a structure supporting only the side surfaces of the plurality of chain units 161, the plurality of chain units 161 that move vertically can wobble in the front-rear direction.

Accordingly, in the display device 500 according to still another exemplary embodiment of the present disclosure, the support blocks 575 supporting the front surfaces 161A3 and 161B3 and the rear surfaces 161A4 and 161B4 of the plurality of chain units 161 in positions where the plurality of chain units 161 are coupled to each other and move straight in the vertical direction, can be disposed, whereby the wobbling of the plurality of chain units 161 in the front-rear direction during the movement of the plurality of chain units 161 can be prevented.

<Guide Structure 5 of Chain Units>

Figure 15:
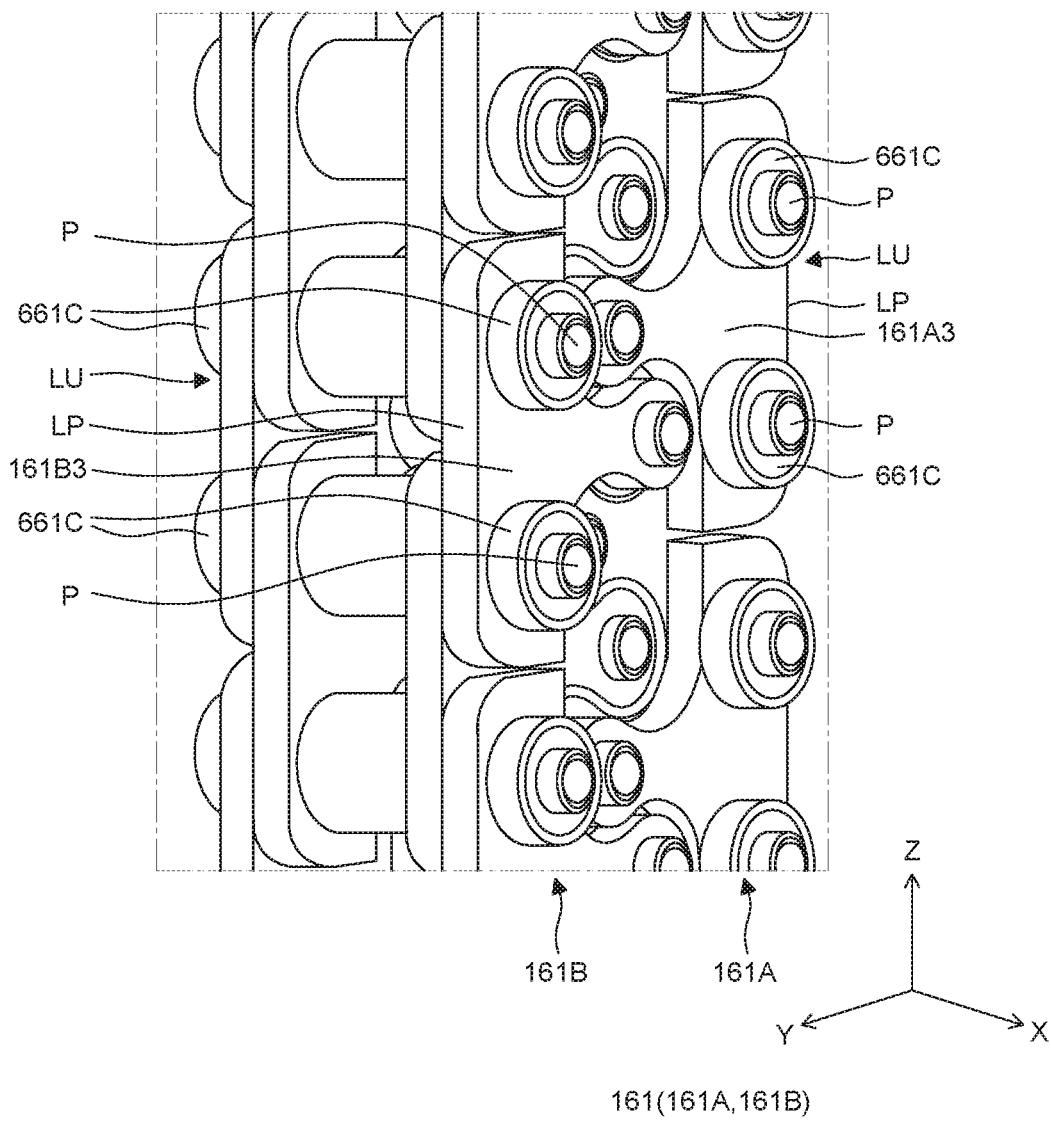
FIG. 15 is a perspective view illustrating a portion of a chain unit of a display device according to still another exemplary embodiment of the present disclosure.
Figure 16:
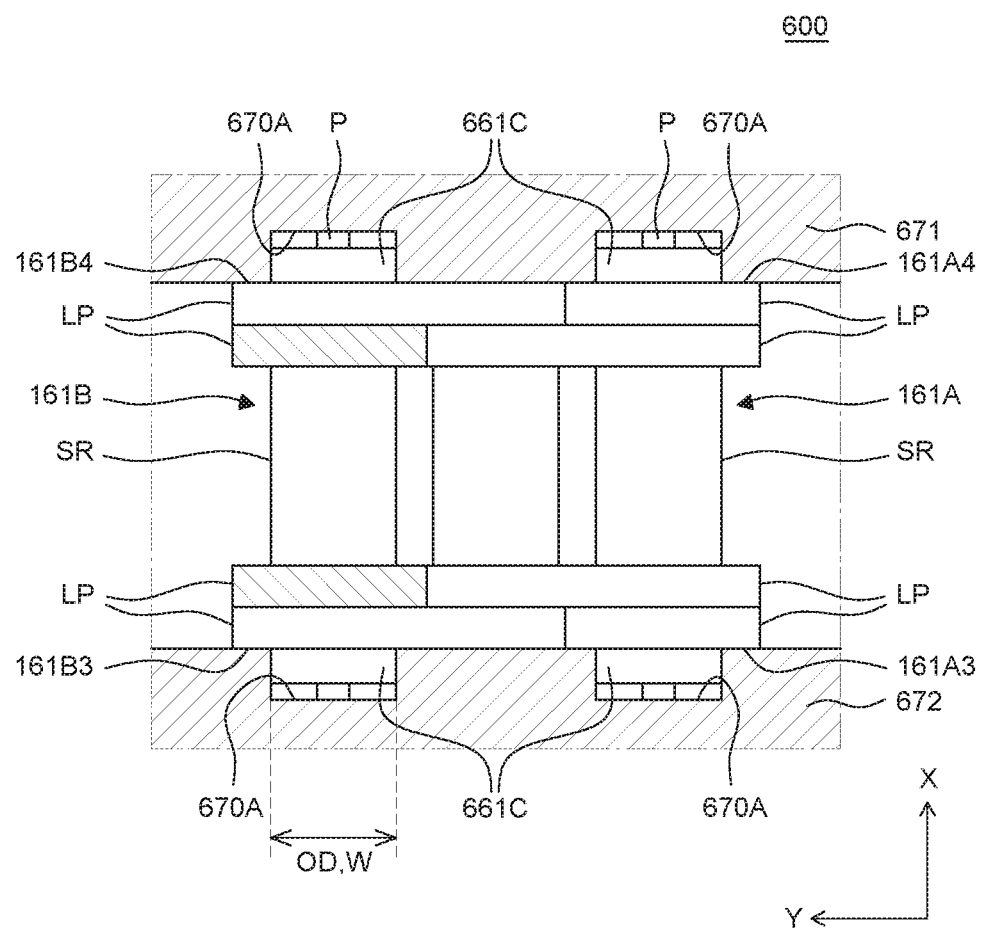
FIG. 16 is a plan view illustrating a coupling structure of a chain unit and a guide groove of a display device according to still another exemplary embodiment of the present disclosure.

FIG. 15 is a perspective view illustrating a portion of a chain unit of a display device according to still another embodiment of the present disclosure. FIG. 16 is a plan view illustrating a coupling structure of a chain unit and a guide groove of a display device according to still another embodiment of the present disclosure. A display device 600 illustrated in FIGS. 15 and 16 is substantially the same as the display device 500 illustrated in FIG. 13, except for rotation guide members 661C and a guide frame 670 and thus, a duplicate description is omitted.

With reference to FIGS. 15 and 16, the display device 600 can further include the rotation guide members 661C coupled to the plurality of chain units 161 and disposed on outer surfaces of the plurality of chain units 161, and guide grooves 670A providing movement paths of the rotation guide members 661C.

The rotation guide members 661C can be coupled with the link unit LU of the first chain unit 161A and disposed on the front surface 161A3 and the rear surface 161A4 of the first chain unit 161A. Also, the rotation guide members 661C can be coupled to the link unit LU of the second chain unit 161B and disposed on the front surface 161B3 and the rear surface 161B4 of the second chain unit 161B. Specifically, the rotation guide members 661C can pass through the support rollers SR and the plurality of link plates LP disposed opposite to each other with respect to the support rollers SR, and can be coupled to one ends and the other ends of the pins P protruding in the front and rear of the respective chain units 161A and 161B. Accordingly, the rotation guide members 661C can be rotatably disposed on the front surfaces 161A3 and 161B3 and the rear surfaces 161A4 and 161B4 of the first chain unit 161A and the second chain unit 161B.

The rotation guide members 661C are disposed in the guide grooves 670A and can perform rolling motions along the guide grooves 670A when driving the plurality of chain units 161 to thereby guide the plurality of chain units 161 in a predetermined direction. For example, the rotation guide member 661C can have a shape of a bearing rotatable in a circumferential direction along an outer circumferential surface of the pin P. However, the rotation guide member 661C is not necessarily limited thereto, and a configuration thereof can be variously changed such that it moves along the guide groove 670A and guides the plurality of chain units 161 in predetermined paths.

With reference to FIG. 16, the guide grooves 670A can be formed in the guide frame 670 to provide movement paths of the rotation guide members 661C. Specifically, a plurality of the guide grooves 670A that provide movement paths of a plurality of the rotation guide members 661C disposed on the rear surface 161A4 of the first chain unit 161A and the rear surface 161B4 of the second chain unit 161B can be formed in a frame body 671 of the guide frame 670 disposed in the rear of the first chain unit 161A and the second chain unit 161B along the front-rear direction, that is, the X-axis direction. In addition, the plurality of guide grooves 670A that guide the plurality of rotation guide members 661C disposed on the front surface 161A3 of the first chain unit 161A and the front surface 161B3 of the second chain unit 161B in predetermined paths can be formed in a frame cover 672 of the guide frame 670 disposed in front of the first chain unit 161A and the second chain unit 161B along the front-rear direction. For example, the guide grooves 670A can provide movement paths, from a state where the plurality of chain units 161 are separated, to a state where the plurality of chain units 161 are coupled to the rotation guide members 661C.

Sizes of the rotation guide member 661C and the guide groove 670A can correspond to each other. Specifically, an outer diameter OD of the rotation guide member 661C having a bearing shape and a width W of the guide groove 670A in which the rotation guide member 661C is accommodated can be equal to each other. Therefore, the guide grooves 670A can limit movements of the rotation guide members 661C in the vertical direction, that is, in the Z-axis direction, at a location where the rotation guide members 661C guide the plurality of chain units 161 in the horizontal direction, that is, in the Y-axis direction. And, the guide grooves 670A can limit movements of the rotation guide members 661C in the horizontal direction at a location where the rotation guide members 661C guide the plurality of chain units 161 in the vertical direction.

As described above, in the display device 600 according to still another exemplary embodiment of the present disclosure, the plurality of rotation guide members 661C having a bearing shape can be disposed on the plurality of chain units 161. In addition, the guide grooves 670A providing movement paths of the rotation guide members 661C and having the size corresponding to the rotation guide members 661C are formed in the guide frame 670 disposed in the front and rear of the plurality of chain units 161. Accordingly, the plurality of rotation guide members 661C guide the plurality of chain units 161 in a predetermined path, whereby the plurality of chain units 161 can be stably driven and the movements of the rotation guide members 661C in the vertical direction and the horizontal direction are restricted. Thus, wobbling of the display device 600 can be prevented.

The exemplary embodiments of the present disclosure can also be described as follows.

According to an aspect of the present disclosure, a display device comprises a display panel; a roller on which the display panel is wound or unwound; and a lifting unit configured to move the display panel in a vertical direction, wherein the lifting unit includes, a plurality of chain units configured to be coupled when ascending and separated when descending; a first power transmission unit configured to lift the plurality of chain units; and a second power transmission unit configured to couple or separate the plurality of chain units by switching movement directions of the plurality of chain units.

The first power transmission unit can be disposed in a position in which the plurality of chain units are coupled to each other, and the second power transmission unit can be disposed below the first power transmission unit in the vertical direction.

The plurality of chain units can include a first chain unit; and a second chain unit disposed to face the first chain unit, and coupled to the first chain unit or separated from the first chain unit, wherein the first chain unit and the second chain unit that are coupled to each other move straight in the vertical direction, and the first chain unit and the second chain unit that are separated from each other move straight in a horizontal direction.

The first power transmission unit can include a first driving sprocket configured to transmit power to the first chain unit; a second driving sprocket configured to transmit power to the second chain unit; and a motor configured to transmit power to any one of the first driving sprocket and the second driving sprocket.

The second power transmission unit can include a first driven sprocket configured to receive power from the first chain unit and switch the movement direction of the first chain unit; and a second driven sprocket configured to receive power from the second chain unit and switch the movement direction of the second chain unit.

The second power transmission unit can be configured to rotate the plurality of chain units while supporting side surfaces of the plurality of chain units.

The display device can further comprise guide rails configured to separate the plurality of chain units that are coupled to the second power transmission unit from the second power transmission unit and guide the plurality of chain units in a horizontal direction.

The display device can further comprise a rotation guide unit configured to guide the plurality of chain units that are rotated by the second power transmission unit in a direction in which the second power transmission unit rotates.

The first power transmission unit can be configured to transmit power to the plurality of chain units, while supporting side surfaces of the plurality of chain units.

The display device can further comprise support blocks configured to support front and rear surfaces of the plurality of chain units.

The lifting unit can further include rotation guide members coupled to the plurality of chain units and disposed on outer surfaces of the plurality of chain units; and guide grooves providing movement paths of the rotation guide members.

Sizes of the rotation guide members and the guide grooves can correspond to each other.

According to another aspect of the present disclosure, a display device comprise a display panel; a roller on which the display panel is wound or unwound; a plurality of chain units configured to lift the display panel; and power transmission units disposed in plural numbers along movement paths of the plurality of chain units, and configured to transmit power to the chain units in at least one position thereof.

The plurality of chain units can have a zipper-type structure in which when ascending, they are coupled to each other and move straight in a vertical direction, while when descending, they are separated from each other and move straight in a horizontal direction.

The plurality of chain units can include a first chain unit; and a second chain unit disposed to face the first chain unit and coupled to the first chain unit or separated from the first chain unit.

The power transmission units include a first power transmission unit disposed in a position in which the first chain unit and the second chain unit are coupled to each other, and configured to transmit power to the first chain unit and the second chain unit to lift and lower the first chain unit and the second chain unit; and a second power transmission unit disposed below the first power transmission unit, and configured to couple or separate the first chain unit and the second chain unit by switching movement directions of the first chain unit and the second chain unit.

The first power transmission unit can include a first driving sprocket configured to transmit power to the first chain unit; a second driving sprocket configured to transmit power to the second chain unit; and a motor configured to transmit power to any one of the first driving sprocket and the second driving sprocket.

The second power transmission unit can include a first driven sprocket configured to receive power from the first chain unit and rotate the first chain unit; and a second driven sprocket configured to receive power from the second chain and rotate the second chain unit.

The first driven sprocket can include a guide boss supporting a side surface of the first chain unit, and wherein the second driven sprocket includes a guide boss supporting a side surface of the second chain unit.

The display device can further comprise guide rails configured to separate the plurality of chain units that are coupled to the second power transmission unit from the second power transmission unit and guide the plurality of chain units in the horizontal direction; and a rotation guide unit configured to guide the plurality of chain units that are rotated by the second power transmission unit in a direction in which the second power transmission unit rotates.

The display device can further comprise support members configured to be coupled to the first driving sprocket and the second driving sprocket to support a side surface of the first chain unit and a side surface of the second chain unit, and rotated by the first driving sprocket and the second driving sprocket to guide the first chain unit and the second chain unit in the vertical direction.

The display device can further comprise support blocks configured to be disposed in a position in which the first chain unit and the second chain unit are coupled to each other and support front and rear surfaces of the first chain unit and the second chain unit.

The display device can further comprise rotation guide members rotatably disposed on front and rear surfaces of the first chain unit and the second chain unit; and guide grooves providing movement paths of the rotation guide members and formed to have a size corresponding to the rotation guide members to limit movements of the rotation guide members in the vertical direction and the horizontal direction.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
a display panel;
a roller on which the display panel is wound or unwound; and
a lifting unit configured to move the display panel in a vertical direction,
wherein the lifting unit includes:
a plurality of chain units configured to be coupled at side surfaces thereof when ascending, and configured to be separated when descending;
a first power transmission unit configured to lift the plurality of chain units; and
a second power transmission unit configured to couple or separate the plurality of chain units by switching movement directions of the plurality of chain units, and
wherein the display device further comprises a plurality of support blocks configured to support front and rear surfaces of the plurality of chain units.

2. The display device of claim 1, wherein the first power transmission unit is disposed in a position in which the plurality of chain units are coupled to each other, and the second power transmission unit is disposed below the first power transmission unit in the vertical direction.

3. The display device of claim 1, wherein the plurality of chain units include:
a first chain unit; and
a second chain unit disposed to face the first chain unit, and coupled to the first chain unit or separated from the first chain unit,
wherein the first chain unit and the second chain unit that are coupled to each other move straight in the vertical direction, and the first chain unit and the second chain unit that are separated from each other move straight in a horizontal direction.

4. The display device of claim 3, wherein the first power transmission unit includes:
a first driving sprocket configured to transmit power to the first chain unit;
a second driving sprocket configured to transmit power to the second chain unit; and
a motor configured to transmit power to any one of the first driving sprocket and the second driving sprocket.

5. The display device of claim 3, wherein the second power transmission unit includes:
a first driven sprocket configured to receive power from the first chain unit and switch the movement direction of the first chain unit; and
a second driven sprocket configured to receive power from the second chain unit and switch the movement direction of the second chain unit.

6. The display device of claim 1, wherein the second power transmission unit is configured to rotate the plurality of chain units while supporting side surfaces of the plurality of chain units.

7. The display device of claim 1, further comprising:
a plurality of guide rails configured to separate the plurality of chain units that are coupled to the second power transmission unit from the second power transmission unit, and guide the plurality of chain units in a horizontal direction.

8. The display device of claim 1, further comprising:
a rotation guide unit configured to guide the plurality of chain units that are rotated by the second power transmission unit in a direction in which the second power transmission unit rotates.

9. The display device of claim 1, wherein the first power transmission unit is configured to transmit power to the plurality of chain units, while supporting side surfaces of the plurality of chain units.

10. A display device, comprising:
a display panel;
a roller on which the display panel is wound or unwound; and
a lifting unit configured to move the display panel in a vertical direction,
wherein the lifting unit includes:
a plurality of chain units configured to be coupled when ascending, and configured to be separated when descending;
a first power transmission unit configured to lift the plurality of chain units; and
a second power transmission unit configured to couple or separate the plurality of chain units by switching movement directions of the plurality of chain units, and
wherein the lifting unit further includes:
a plurality of rotation guide members coupled to the plurality of chain units and disposed on outer surfaces of the plurality of chain units; and
a plurality of guide grooves providing movement paths of the plurality of rotation guide members.

11. The display device of claim 10, wherein sizes of the plurality of rotation guide members and the plurality of guide grooves correspond to each other.

12. A display device, comprising:
a display panel;
a roller on which the display panel is wound or unwound;
a plurality of chain units configured to be coupled at side surfaces thereof to lift the display panel;
a plurality of power transmission units disposed in plural numbers along movement paths of the plurality of chain units, and configured to transmit power to the plurality of chain units in at least one position thereof; and
a plurality of support blocks configured to support front and rear surfaces of the plurality of chain units.

13. The display device of claim 12, wherein the plurality of chain units have a zipper-type structure in which when ascending, they are coupled to each other and move straight in a vertical direction, while when descending, they are separated from each other and move straight in a horizontal direction.

14. The display device of claim 13, wherein the plurality of chain units include:
a first chain unit; and
a second chain unit disposed to face the first chain unit and coupled to the first chain unit or separated from the first chain unit.

15. The display device of claim 14, wherein the power transmission units include:
a first power transmission unit disposed in a position in which the first chain unit and the second chain unit are coupled to each other, and configured to transmit power to the first chain unit and the second chain unit to lift and lower the first chain unit and the second chain unit; and
a second power transmission unit disposed below the first power transmission unit, and configured to couple or separate the first chain unit and the second chain unit by switching movement directions of the first chain unit and the second chain unit.

16. The display device of claim 15, wherein the first power transmission unit includes:
a first driving sprocket configured to transmit power to the first chain unit;
a second driving sprocket configured to transmit power to the second chain unit; and
a motor configured to transmit power to any one of the first driving sprocket and the second driving sprocket.

17. The display device of claim 16, further comprising:
a plurality of support members configured to be coupled to the first driving sprocket and the second driving sprocket to support a side surface of the first chain unit and a side surface of the second chain unit, and rotated by the first driving sprocket and the second driving sprocket to guide the first chain unit and the second chain unit in the vertical direction.

18. The display device of claim 14, wherein the plurality of support blocks are configured to be disposed in a position in which the first chain unit and the second chain unit are coupled to each other.

19. The display device of claim 14, further comprising:
a plurality of rotation guide members rotatably disposed on front and rear surfaces of the first chain unit and the second chain unit; and a plurality of guide grooves providing movement paths of the plurality of rotation guide members, and formed to have a size corresponding to the plurality of rotation guide members to limit movements of the plurality of rotation guide members in the vertical direction and the horizontal direction.

20. The display device of claim 15, wherein the second power transmission unit includes:
a first driven sprocket configured to receive power from the first chain unit and rotate the first chain unit; and
a second driven sprocket configured to receive power from the second chain and rotate the second chain unit.

21. The display device of claim 20, wherein the first driven sprocket includes a guide boss supporting a side surface of the first chain unit, and
wherein the second driven sprocket includes a guide boss supporting a side surface of the second chain unit.

22. The display device of claim 15, further comprising:
a plurality of guide rails configured to separate the plurality of chain units that are coupled to the second power transmission unit from the second power transmission unit, and guide the plurality of chain units in the horizontal direction; and
a rotation guide unit configured to guide the plurality of chain units that are rotated by the second power transmission unit in a direction in which the second power transmission unit rotates.

* * * * *